United States Patent
Son et al.

(10) Patent No.: US 10,099,938 B2
(45) Date of Patent: Oct. 16, 2018

(54) ELECTRICALLY CONDUCTIVE THIN FILMS

(71) Applicant: Samsung Electronics Co., Ltd., Suwon-Si, Gyeonggi-Do (KR)

(72) Inventors: Yoon Chul Son, Hwaseong-si (KR); Byungki Ryu, Hwaseong-si (KR); Sang Mock Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 765 days.

(21) Appl. No.: 14/567,900

(22) Filed: Dec. 11, 2014

(65) Prior Publication Data

US 2015/0166340 A1  Jun. 18, 2015

(30) Foreign Application Priority Data

Dec. 12, 2013 (KR) .................. 10-2013-0154946
Dec. 11, 2014 (KR) .................. 10-2014-0178058

(51) Int. Cl.
| | | |
|---|---|---|
| *C01B 19/00* | (2006.01) | |
| *C01B 19/04* | (2006.01) | |
| *H01B 1/08* | (2006.01) | |
| *H01B 1/10* | (2006.01) | |
| *C01G 23/04* | (2006.01) | |
| *H01L 31/0224* | (2006.01) | |
| *H01L 51/52* | (2006.01) | |

(52) U.S. Cl.
CPC .......... *C01G 23/043* (2013.01); *C01B 19/007* (2013.01); *H01L 31/022466* (2013.01); *C01P 2004/24* (2013.01); *H01L 51/5206* (2013.01); *H01L 51/5234* (2013.01)

(58) Field of Classification Search
CPC ......... H01L 31/022466; H01L 51/5234; C01B 19/007; C01P 2004/24
See application file for complete search history.

(56) References Cited

U.S. PATENT DOCUMENTS

| 4,996,108 A | 2/1991 | Divigalpitiya et al. |
| 5,995,359 A | 11/1999 | Klee et al. |
| 6,123,876 A | 9/2000 | Kobayashi et al. |

(Continued)

FOREIGN PATENT DOCUMENTS

| CN | 1146061 A | 3/1997 |
| CN | 101770870 A | 7/2010 |

(Continued)

OTHER PUBLICATIONS

European Search Report dated May 4, 2015 issued in European Application No. 14197479.0.

(Continued)

*Primary Examiner* — Laura A Auer
(74) *Attorney, Agent, or Firm* — Harness, Dickey & Pierce, P.L.C.

(57) ABSTRACT

According to example embodiments, a transparent electrically conductive film including a compound that has a two-dimensional electron gas layer, and has a product of an absorption coefficient (α) for light having a wavelength of about 550 nm at 25° C. and a resistivity value (ρ) thereof of less than or equal to about 30 Ω/sq is provided. The electrically conductive film may be a layered crystal structure of the compound.

13 Claims, 19 Drawing Sheets

(56) References Cited

U.S. PATENT DOCUMENTS

| | | | |
|---|---|---|---|
| 7,507,289 | B2 | 3/2009 | Hosono et al. |
| 7,585,349 | B2 | 9/2009 | Xia et al. |
| 8,294,133 | B2 | 10/2012 | Ikeda |
| 9,447,927 | B2 | 9/2016 | Mahler et al. |
| 9,958,137 | B2 | 5/2018 | Mahler et al. |
| 2008/0018978 | A1* | 1/2008 | Jang .................. G02F 1/133603 359/266 |
| 2009/0073640 | A1 | 3/2009 | Venigalla |
| 2010/0200286 | A1 | 8/2010 | Melcher et al. |
| 2010/0238535 | A1* | 9/2010 | Wang ....................... C09K 9/00 359/275 |
| 2012/0153236 | A1 | 6/2012 | Cakmak et al. |
| 2012/0300168 | A1 | 11/2012 | Hoke |
| 2013/0006827 | A1 | 1/2013 | Kaus |
| 2013/0068270 | A1 | 3/2013 | Choi et al. |
| 2013/0220405 | A1 | 8/2013 | Mahler et al. |
| 2013/0260136 | A1* | 10/2013 | Wu ........................ B82Y 40/00 428/323 |
| 2013/0302593 | A1 | 11/2013 | Coleman et al. |

FOREIGN PATENT DOCUMENTS

| | | |
|---|---|---|
| EP | 0905273 A2 | 3/1999 |
| EP | 0905273 A3 | 3/1999 |
| JP | 08-203335 | 8/1996 |
| JP | 2007-149996 A | 6/2007 |
| JP | 2007-320829 A | 12/2007 |
| JP | 2015-518647 | 7/2015 |
| WO | WO-02/095841 A2 | 11/2002 |
| WO | WO-03/041183 A1 | 5/2003 |
| WO | WO-2010/119687 A1 | 10/2010 |

OTHER PUBLICATIONS

Kei Inumaru, et al. "Synthesis and high metallic conductivity of layer-structured Sr2N thin film deposited onto MgO(001) substrate", Jornal of Alloys and Compounds, vol. 372, pp. L1-L3, (2004).
Kimoon Lee, et al. "Dicalcium nitride as a two-dimensional electride with an anionic electron layer", Nature, vol. 494, pp. 336-341, (2013).
Robert L. Abdon, et al. "Hf3Te2: A New and Remarkable Layered Compound", Angew. Chem. Int. Ed. Engl., vol. 33, No. 22, pp. 2328-2330, (1994).
Basic Assumptions of the Model Collision or Relaxation Times DC Electrical Conductivity Hall Effect and Magnetoresistance AC Electrical Conductivity Dielectric Function and Plasma Resonance Thermal Conductivity Thermoelectric Effects, The Drude Theory of Metals, pp. 1-20.
Jinwoong Kim, et al. "Color of TiN and ZrN from first-principles calculations", Journal of Applied Physics, vol. 110, pp. 083501-083501-5, (2011).
Xuesong Li, et al. "Transfer of Large-Area Graphene Films for High-Performance Transparent Conductive Electrodes", Nano Letters, vol. 9, No. 12, pp. 4359-4363, (2009).
Sukang Bae, et al. "Roll-to-Roll production of 30-inch graphene films for transparent electrodes", Nature Nanotechnoloy, vol. 5, pp. 574-578, (2010).
Klaus Ellmer, "Past achievements and future challenges in the development of optically transparent electrodes", Nature Phonics, vol. 6, pp. 809-817, (2012).

Sandip Dey, et al. "Platinum Group Metal Chalcogenides", Platinum Metals Rev., vol. 48, pp. 16-29, (2004).
Yongjie Zhan, et al. "Large-Area Vapor-Phase Growth and Characterization of MoS2 Atomic Layers on a SiO2 Substrate", Small, vol. 8, No. 7, pp. 966-971, (2012).
Markus Ströbele, et al. "Structure and Electrochemical Study of Nb3Cl8", Z. Anorg. Allg. Chem., vol. 627, pp. 2002-2004, (2001).
Georg Kresse, et al. "Vienna Ab-initio Package Simulation" http://www.vasp.at, pp. 1-155, (2011).
U. Steinbrenner, et al. "Ba3N—A New Binary Nitride of an Alkaline Earth Metal", Z. anorg. Allg. Chem., vol. 624, pp. 228-232, (1998).
Duncan H. Gregory, et al. "Dicalcium nitride, Ca2N-a 2D "excess electron" compound; synthetic routes and crystal chemistry", Journal of Materials Chemistry, vol. 10, pp. 1635-1641, (2000).
Kimoon Lee, et al. "Dicalcium nitride as a two-dimensional electride with an anionic electron layer", Nature, vol. 494, (2013).
Grigori V. Vajenine, et al. "Interplay of metallic and ionic bonding in layered subnitrides AE2N (Ae=Ca, Sr, or Ba) under high pressure", C.R. Chimie, vol. 8, pp. 1897-1905, (2005).
Xiaoqiang Yao, et al. "Nb1.72Ta3.28 S2: A Novek Phase in the Ta—Nb Ternary System with a Layered Structure" American Chemical Society, vol. 113, pp. 1426-1427, (1991).
Arthur Williams, "Neutron powder diffraction study of silver subfluride" m J. Pjys.: Condens. Matter, pp. 2569-2574, (1989).
Sten Andersson, et al. "Phase Analysis Studies on the Titanium-Oxygen System", Acta. Chem. Scand., vol. 11, No. 10, pp. 1641-1652, (1957).
J.P. Maehlen, et al. "Structural studies of deuterides of yttrium carbide", Journal of Alloys and Compounds, vol. 351, pp. 151-157, (2003).
Kenji Hiraga, et al. "The Formation of Varieties of Carbon Ordering in Pseudobinary Compounds of V2C, Nb2C and Ta2C", J. Appl. Cryst., vol. 13, pp. 17-23, (1980).
Bernd Harbrecht, "Ta2Se: A Tantalum-Rich Selenide with a New Layer Structure", Angew. Chem. Int. Ed. Engl., vol. 12, No. 28, pp. 1660-1662, (1989).
Khi-Ruey Tsai, et al. "The Crystal Structure of Tricesium Monoxide", Crytsal Structure of Tricesium Monoxide, pp. 345-347, (1956).
Ana Laura Elias, et al. "Controlled Synthesis and Transfer of Large-Area WS2 Sheets: From Single Layer to Few Layers", ASC NANO, vol. 6, No. 7, pp. 5235-5242, (2013).
Jeng-Yu Lin, et al. "Electrophoretic deposition of transparent MoS2-graphene nanosheet composite films as counter electrodes in dye-sensitized solar cells", ChemComm Communication, vol. 49, pp. 1440-1442, (2013).
H. Bolivar, et al. "Methanol oxidation at Pt/MoOx/MoSe2 thin film electrodes prepared with exfoliated MoSe2", Journal of Applied Electrochemistry, vol. 33, pp. 1191-1198, (2003).
Hee Sung Lee, et al. "MoS2 Nanosheet Phototransistors with Thickness-Modulated Optical Energy Gap", Nano Letters, vol. 12, pp. 3695-3700, (2002).
Manish Chhowalla, et al. "The chemistry of two-dimensional layered transition metal dichalcogenide nanosheets", Nature Chemisty, vol. 5, pp. 263-275, (2013).
Qing Hua Wang, et al. "Electronics and optoelectronics of two-dimensional transition metal dichalcogenides", Nature Nanotechnology, vol. 7, pp. 699-712 (2012).
Chinese Office Action dated Nov. 3, 2017 issued in corresponding Chinese Application No. 201410771979.2 (English translation provided).
Office Action dated Feb. 27, 2018 in Japanese Application No. 2014-252293.

* cited by examiner

ELECTRICALLY CONDUCTIVE THIN FILMS

RELATED APPLICATIONS

This application claims priority under 35 U.S.C. § 119 to Korean Patent Application Nos. 10-2013-0154946 and 10-2014-0178058, filed in the Korean Intellectual Property Office on Dec. 12, 2013 and Dec. 11, 2014, respectively, the entire contents of each of which are incorporated herein by reference.

BACKGROUND

1. Field

The present disclosure relates to transparent electrically conductive films and/or an electronic device including the same.

2. Description of the Related Art

An electronic device like a flat panel display such as an LCD or LED, a touch screen panel, a solar cell, a transparent transistor, and the like may include a transparent electrically conductive film. It is desirable for a material of an electrically conductive film to have high light transmittance (e.g., greater than or equal to about 80% in a visible light region) and low specific resistance (e.g., less than or equal to about $1 \times 10^{-3}$ Ω*cm). Currently available materials for transparent and electrically conductive films include indium tin oxide (ITO), tin oxide ($SnO_2$), zinc oxide (ZnO), and the like. The ITO has poor flexibility. Also, limited reserves of the indium may cause a cost increase. Therefore, development of an alternative material is desired. The tin oxide and the zinc oxide show low conductivity and have poor flexibility.

Therefore, there is an urgent need to develop transparent conducting films having excellent flexibility, higher transparency, and enhanced conductivity.

SUMMARY

The present disclosure relates to transparent electrically conductive films and/or an electronic device including the same.

The present disclosure also relates to a conductive film having high conductivity and excellent light transmittance and/or an electronic device including the electrically conductive film.

According to example embodiments, an electrically conductive film includes a compound having a layered crystal structure. The compound includes one of: a transition metal suboxide represented by $M_2O$ (wherein M is Sc, Y, Ti, Zr, Hf, V, Nb, Ta, Cr, Mo, W, Mn, Tc, Re, Ag or a combination thereof); an alkali metal suboxide represented by $A_3O$, $A_2O$, $A_6O$, or $A_7O$ (wherein A includes one of Cs, Rb, K, Na, and a combination thereof); an alkali earth metal subnitride represented by $AE_2N$ (wherein AE is Mg, Sr, Ba, or a combination thereof) or $AE_3N$ (wherein AE is Mg, Ca, Sr, Ba, or a combination thereof); a transition element subcarbide represented by $M_2C$ or $M_4C$ (wherein M includes one of Sc, Y, Ti, Zr, Hf, V, Nb, Ta, Cr, Mo, W, Mn, Tc, Re, Ag, and a combination thereof); a transition metal rich chalcogenide represented by $M_3E_2$, $M_2E$, $M_5E$, $M_5E_2$, $M_4E_3$, or ME (wherein M includes one of Sc, Y, Ti, Zr, Hf, V, Nb, Ta, Cr, Mo, W, Mn, Tc, Re, Ag, and a combination thereof and E is one of S, Se, and Te); and a transition metal subhalide represented by $M_2X$ or MX (wherein M includes one of Sc, Y, Ti, Zr, Hf, V, Nb, Ta, Mn, Tc, Re, Ag, and a combination thereof, and X includes one of F, Cl, Br, and I).

In example embodiments, a transmittance of the electrically conductive film may be greater than or equal to about 80% and less than or equal to about 100% for light at a wavelength of about 550 nm at a thickness of greater than 0 nm and less than or equal to about 100 nm.

In example embodiments, the compound may have a product of an absorption coefficient (α) for light having a wavelength of about 550 nm at 25° C. and a resistivity value (ρ) thereof of less than or equal to about 30 Ω/sq and greater than or equal to about Ω/sq.

In example embodiments, compound may have a product of an absorption coefficient (α) for light having a wavelength of about 550 nm at 25° C. and a resistivity value (ρ) thereof of less than or equal to about 5 Ω/sq and greater than or equal to about Ω/sq.

In example embodiments, the layered crystal structure may be one of a trigonal system with a P-3m1 space group, a trigonal system with a R3-MH space group, a tetragonal system with a I4/MMM space group, and a hexagonal system with a P63/mcm space group.

In example embodiments, the compound may include a two-dimensional electron gas layer. The layered crystal structure may include a plurality of unit structures stacked on top of each other. Each one of the plurality of unit structures may include a repeating unit structure of the compound. The two-dimensional electron gas layer may be one of between unit structures of the compound or within the unit structures of the compound. In example embodiments, a binding energy between the unit structures of the compound may be greater than 0 meV/Å$^2$ and less than or equal to about 100 meV/Å$^2$.

In example embodiments, the compound may be selected from $Ag_2F$, $Cs_3O$, $Hf_3Te_2$, $Sr_2N$, $(Ta, Nb)_5S_2$, $Y_2C$, $Ti_2O$, $Ba_2N$, $Nb_2C$, $Ba_3N$, $Ta_2Se$, and a combination thereof.

In example embodiments, a thickness of the electrically conductive film may be greater than 0 nm and less than or equal to about 100 nm.

In example embodiments, the electrically conductive film may be a continuous film and may be formed by a vapor deposition process.

In example embodiments, the electrically conductive film may include a plurality of nanosheets stacked on top of each other. Each one of the plurality of nanosheets may include the compound, and the nanosheets may contact one another to provide an electrical connection. The electrically conductive film may include a discontinuous layer having a gap therein.

In example embodiments, an electronic device may include the above-described electrically conductive film.

In example embodiments, the electronic device may be one of a display, a touch screen panel, a solar cell, an e-window, an electrochromic mirror, a heat mirror, a transparent transistor, and a flexible display.

Example embodiments relate to a transparent conductive material that has conductivity far higher than that of the ITO electrode, enhanced light transmittance, and excellent flexibility is provided.

According to example embodiments, an electrically conductive film includes at least one stacked structure including a plurality of unit structures stacked on top of each other. The unit structures define a layered crystal structure that includes a two-dimensional electron gas between the unit structures or within the unit structures. Each of the unit structures includes a repeating unit of the compound. The compound includes one of an alkali metal suboxide, a transition metal suboxide, an alkali earth metal subnitride, a transition metal subcarbide, a transition metal rich chalcogenide, and a transition metal subhalide.

In example embodiments, a thickness of the at least one stacked structure may be greater than 0 nm and less than or equal to about 100 nm.

In example embodiments, the alkali metal suboxide may be represented by $A_3O$, $A_2O$, $A_6O$, or $A_7O$ (wherein A includes one of Cs, Rb, K, Na, and a combination thereof), the transition metal suboxide may be represented by $M_2O$ (wherein M is Sc, Y, Ti, Zr, Hf, V, Nb, Ta, Cr, Mo, W, Mn, Tc, Re, Ag or a combination thereof, the alkali earth metal subnitride may be represented by $AE_2N$ (wherein AE is Mg, Sr, Ba, or a combination thereof) or $AE_3N$ (wherein AE is Mg, Ca, Sr, Ba, or a combination thereof), the transition element subcarbide may be represented by $M_2C$ or $M_4C$ (wherein M includes one of Sc, Y, Ti, Zr, Hf, V, Nb, Ta, Cr, Mo, W, Mn, Tc, Re, Ag, and a combination thereof), the transition metal rich chalcogenide may be represented by $M_3E_2$, $M_2E$, $M_5E$, $M_5E_2$, $M_4E_3$, or ME (wherein M includes one of Sc, Y, Ti, Zr, Hf, V, Nb, Ta, Cr, Mo, W, Mn, Tc, Re, Ag, and a combination thereof and E is one of S, Se, and Te), and the transition metal subhalide represented by $M_2X$ or MX (wherein M includes one of Sc, Y, Ti, Zr, Hf, V, Nb, Ta, Mn, Tc, Re, Ag, and a combination thereof, and X includes one of F, Cl, Br, and I).

In example embodiments, the repeating unit of the compound may be one of: defined by one layer of an anionic element between two layers of a metal atom, defined by three layers of an alkali metal stacked on top of each other and a layer of oxygen atoms arranged adjacent to the three layers of the alkali metal as a middle layer of the three layers of the alkali metal, defined by three layers of an alkali earth metal stacked on top of each other and a layer of nitrogen atoms arranged adjacent to the three layers of the alkali earth metal as a middle layer of the three layers of the alkali earth metal, and defined by two to five layers of a metal element between two layers of a chalcogen atom.

In example embodiments, the compound may be selected from $Ag_2F$, $Cs_3O$, $Hf_3Te_2$, $Sr_2N$, $(Ta, Nb)_5S_2$, $Y_2C$, $Ti_2O$, $Ca_2N$, $Ba_2N$, $Nb_2C$, $Ba_3N$, $Ta_2Se$, and a combination thereof.

In example embodiments, a length of the electrically conductive film may be greater than 0 nm and less than or equal to about 500 μm.

In example embodiments, a transmittance of the electrically conductive film may be greater than or equal to about 80% and less than or equal to about 100% for light at a wavelength of about 550 nm at a thickness of greater than 0 nm and less than or equal to about 100 nm.

In example embodiments, a transmittance of the electrically conductive film may be greater than or equal to about 80% and less than or equal to about 100% for light at a wavelength of about 550 nm at a thickness of greater than 0 nm and less than or equal to about 100 nm.

In example embodiments, the compound may have a product of an absorption coefficient (α) for light having a wavelength of about 550 nm at 25° C. and a resistivity value (ρ) thereof of less than or equal to about 30 Ω/sq and greater than or equal to about Ω/sq.

In example embodiments, the layered crystal structure may be one of a trigonal system with a P-3m1 space group, a trigonal system with a R3-MH space group, a tetragonal system with a I4/MMM space group, and a hexagonal system with a P63/mcm space group.

In example embodiments, a binding energy between the unit structures of the compound may be greater than 0 meV/Å$^2$ and less than or equal to about 100 meV/Å$^2$.

In example embodiments, the at least one stacked structure may be a plurality of stacked structure. The plurality of stacked structures may contact each other and at least partially overlap with each other to define a contiguous network of stacked structures that extends horizontally. The plurality of stacked structures may be nanosheets.

In example embodiments, the plurality of unit structures may include a plurality of first unit structures on a plurality of second unit structures. The compound in the plurality of first unit structures may be a first compound. The compound in the plurality of second unit structures may be a second compound that is different than first compound. The first compound and the second compound may include different ones of the alkali metal suboxide, the transition metal suboxide, the alkali earth metal subnitride, the transition metal subcarbide, the transition metal rich chalcogenide, and the transition metal subhalide.

In example embodiments, the alkali metal suboxide may be represented by $A_3O$, $A_2O$, $A_6O$, or $A_7O$ (wherein A includes one of Cs, Rb, K, Na, and a combination thereof), the transition metal suboxide may be represented by $M_2O$ (wherein M is Sc, Y, Ti, Zr, Hf, V, Nb, Ta, Cr, Mo, W, Mn, Tc, Re, Ag or a combination thereof, the alkali earth metal subnitride may be represented by $AE_2N$ (wherein AE is Mg, Sr, Ba, or a combination thereof) or $AE_3N$ (wherein AE is Mg, Ca, Sr, Ba, or a combination thereof), the transition element subcarbide may be represented by $M_2C$ or $M_4C$ (wherein M includes one of Sc, Y, Ti, Zr, Hf, V, Nb, Ta, Cr, Mo, W, Mn, Tc, Re, Ag, and a combination thereof), the transition metal rich chalcogenide may be represented by $M_3E_2$, $M_2E$, $M_5E$, $M_5E_2$, $M_4E_3$, or ME (wherein M includes one of Sc, Y, Ti, Zr, Hf, V, Nb, Ta, Cr, Mo, W, Mn, Tc, Re, Ag, and a combination thereof and E is one of S, Se, and Te), and the transition metal subhalide represented by $M_2X$ or MX (wherein M includes one of Sc, Y, Ti, Zr, Hf, V, Nb, Ta, Mn, Tc, Re, Ag, and a combination thereof, and X includes one of F, Cl, Br, and I).

In example embodiments, the first compound and the second compound may be different ones of $Ag_2F$, $Cs_3O$, $Hf_3Te_2$, $Sr_2N$, $(Ta, Nb)_5S_2$, $Y_2C$, $Ti_2O$, $Ca_2N$, $Ba_2N$, $Nb_2C$, $Ba_3N$, and $Ta_2Se$.

In example embodiments, the plurality of first unit structures may be on top of the plurality of second unit structures.

In example embodiments, an electronic device may include the above-described electrically conductive film. The electronic device may be one of a flat panel display, a touch screen panel, a solar cell, an e-window, an electrochromic mirror, a heat mirror, a transparent transistor, and a flexible display.

According to example embodiments, a method of making an electronic conductive film includes: forming at least one stacked structure including a plurality of unit structures stacked on top of each other, the unit structures defining a layered crystal structure that includes a two-dimensional electron gas between the unit structures or within the unit structures. Each of the unit structures includes a repeating unit of a compound. The compound includes one of alkali metal suboxide, a transition metal suboxide, an alkali earth metal subnitride, a transition metal subcarbide, a transition metal rich chalcogenide, and a transition metal subhalide.

In example embodiments, the forming the at least one stacked structure may include: producing a plurality of nanosheets of the compound by subjecting a bulk material of the compound or a powder of the compound to liquid phase exfoliation, and bringing the plurality of nanosheets into contact with each other.

In example embodiments, the forming the at least one stacked structure may include: forming a bulk structure of the compound on a substrate using a deposition process, forming a powder of the compound by pulverizing the bulk structure of the compound, dispersing the powder in a solvent, and generating nanosheets of the powder of the compound.

In example embodiments, the alkali metal suboxide may be represented by $A_3O$, $A_2O$, $A_6O$, or $A_7O$ (wherein A includes one of Cs, Rb, K, Na, and a combination thereof), the transition metal suboxide may be represented by $M_2O$ (wherein M is Sc, Y, Ti, Zr, Hf, V, Nb, Ta, Cr, Mo, W, Mn, Tc, Re, Ag or a combination thereof, the alkali earth metal subnitride may be represented by $AE_2N$ (wherein AE is Mg, Sr, Ba, or a combination thereof) or $AE_3N$ (wherein AE is Mg, Ca, Sr, Ba, or a combination thereof), the transition element subcarbide may be represented by $M_2C$ or $M_4C$ (wherein M includes one of Sc, Y, Ti, Zr, Hf, V, Nb, Ta, Cr, Mo, W, Mn, Tc, Re, Ag, and a combination thereof), the transition metal rich chalcogenide may be represented by $M_3E_2$, $M_2E$, $M_5E$, $M_5E_2$, $M_4E_3$, or ME (wherein M includes one of Sc, Y, Ti, Zr, Hf, V, Nb, Ta, Cr, Mo, W, Mn, Tc, Re, Ag, and a combination thereof and E is one of S, Se, and Te), and the transition metal subhalide represented by $M_2X$ or MX (wherein M includes one of Sc, Y, Ti, Zr, Hf, V, Nb, Ta, Mn, Tc, Re, Ag, and a combination thereof, and X includes one of F, Cl, Br, and I).

In example embodiments, the compound may be selected from $Ag_2F$, $Cs_3O$, $Hf_3Te_2$, $Sr_2N$, $(Ta, Nb)_5S_2$, $Y_2C$, $Ti_2O$, $Ca_2N$, $Ba_2N$, $Nb_2C$, $Ba_3N$, $Ta_2Se$, and a combination thereof.

BRIEF DESCRIPTION OF THE DRAWINGS

The foregoing and other features of example embodiments will be apparent from the more particular description of non-limiting embodiments, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
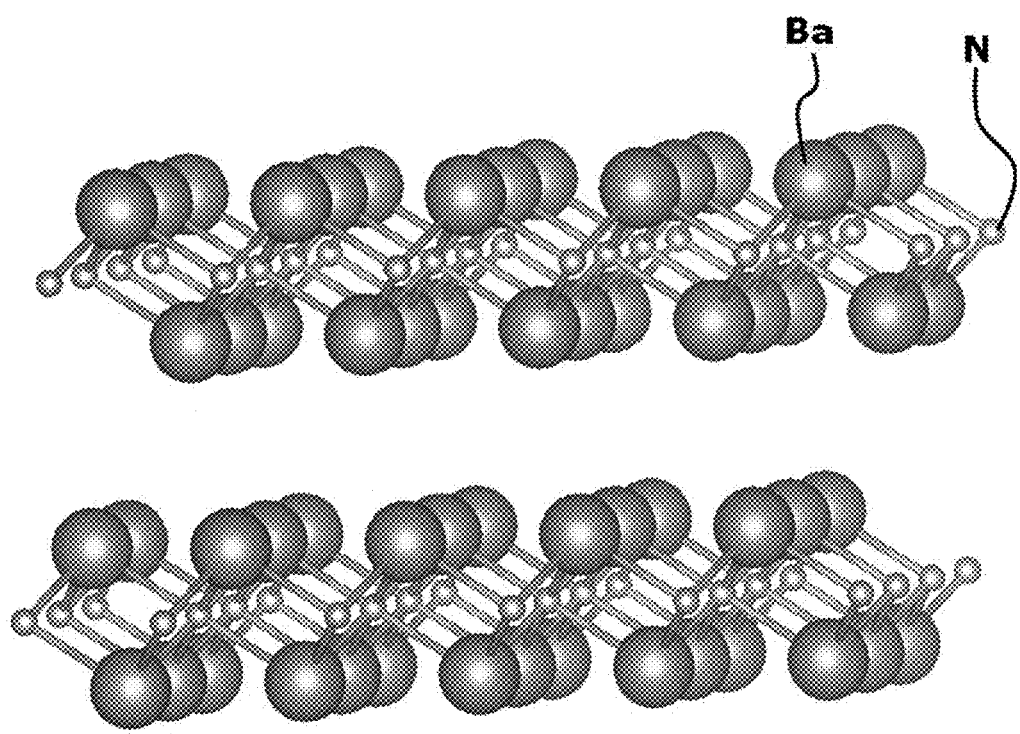
FIG. 1 is a view schematically illustrating a crystal structure of $Ba_2N$.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. Therefore, in some example embodiments, well-known process technologies may not be explained in detail in order to avoid unnecessarily obscuring aspects of example embodiments. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, the term "suboxide" refers to a class of oxides wherein the electropositive element (e.g., a metal element) is in excess relative to the "normal" oxides.

As used herein, the term "subnitride" refers to a class of nitrides wherein the electropositive element (e.g., a metal element) is in excess relative to the "normal" nitrides. As used herein, the term "subcarbide" refers to a class of carbides wherein the electropositive element (e.g., a metal element) is in excess relative to the "normal" carbides.

As used herein, the term "subhalide" refers to a class of halides wherein the electropositive element (e.g., a metal element) is in excess relative to the "normal" halides. As used herein, the term "two dimensional electron gas (2-DEG)" refers to gas of electrons free to move in two dimensions, but tightly confined in the third. As used herein, the term "unit structure" may refer to "the smallest layered structure" repeating in the crystal structure.

In example embodiments, an electrically conductive film includes a compound having a layered crystal structure. The compound may be selected from: an alkali metal suboxide represented by $A_3O$, $A_2O$, $A_6O$, or $A_7O$ (wherein A may be an alkali metal such as at least one of Cs, Rb, K, Na, and a combination thereof); a transition metal suboxide represented by $M_2O$ (wherein M may be a transition metal such as Ti Sc, Y, Zr, Hf, V, Nb, Ta, Cr, Mo, W, Mn, Tc, Re, Ag or a combination thereof), an alkali earth metal subnitride represented by $AE_2N$ (wherein AE may be an alkali earth metal such as at least one of Mg, Sr, Ba, and a combination thereof) or $AE_3N$ (wherein AE may be an alkali earth metal such as at least one of Mg, Ca, Sr, Ba, and a combination thereof); a transition element subcarbide represented by $M_2C$ or $M_4C$ (wherein M may be a transition element such as a transition metal such as at least one of Sc, Y, Ti, Zr, Hf, V, Nb, Ta, Cr, Mo, W, Mn, Tc, Re, Ag, and a combination thereof); a transition metal rich chalcogenide represented by $M_3E_2$, $M_2E$, $M_5E$, $M_5E_2$, $M_4E_3$, or ME (wherein M may be a transition element such as a transition metal such as at least one of Sc, Y, Ti, Zr, Hf, V, Nb, Ta, Cr, Mo, W, Mn, Tc, Re, Ag, and a combination thereof and E may be S, Se, or Te); and a transition metal subhalide represented by $M_2X$ or MX (wherein M may be a transition metal such as at least one of Sc, Y, Ti, Zr, Hf, V, Nb, Ta, Mn, Tc, Re, Ag, and a combination thereof, and X may be a halogen such as F, Cl, Br, or I).

In example embodiments, the compound may have a two-dimensional electron gas layer. In example embodiments, the compound may have a product of an absorption coefficient ($\alpha$) for light having a wavelength of about 550 nm at 25° C. and specific resistivity ($\rho$) thereof of less than or equal to about 30 $\Omega$/sq. In example embodiments, the compound may have a product of an absorption coefficient ($\alpha$) for light having a wavelength of about 550 nm at 25° C. and specific resistivity ($\rho$) thereof of less than or equal to about 5 $\Omega$/sq.

In example embodiments, the compound may be selected from $Ag_2F$, $Cs_3O$, $Hf_3Te_2$, $Sr_2N$, $(Ta, Nb)_5S_2$, $Y_2C$, $Ti_2O$, $Ba_2N$, $Nb_2C$, $Ba_3N$, $Ta_2Se$, and a combination thereof.

In example embodiments, the compound has a layered crystal structure. Each unit structure (e.g., layer) of the layered crystal structure may include a nanosheet having a repeating unit structure. For example, a unit structure of the layered crystal structure may include at least two layers of metal atoms in a repeating unit structure.

In example embodiments, the layered crystal structure of the compound may have two, three, four, or five layers of metal atoms in the repeating unit structure.

FIGS. 14A to 14F are sectional views of electrically conductive thin films according to example embodiments.

Figure 14A:
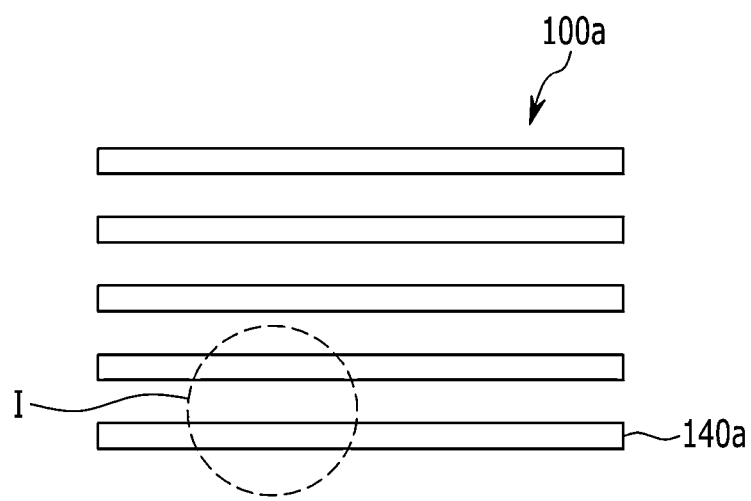
FIGS. 14A to 14F are sectional views of electrically conductive thin films according to example embodiments.

Referring to FIG. 14A, according to example embodiments, an electrically conductive thin film 100a may include a plurality of unit structures 140a stacked on top of each other. The electrically conductive thin film 100a may be based on a layered crystal structure of the compound, where each unit structure 140a may include a nanosheet of one of the aforementioned compounds and may have a repeating unit structure.

Although FIG. 14A illustrates an electrically conductive thin film 100a with five unit structures 140a stacked on top of each other, example embodiments are not limited thereto. For example, the electrically conductive thin film 100a may have a thickness that is greater than 0 nm and less than or equal to about 100 nm, and/or a thickness that is greater than 0 nm and less than or equal to 5 nm; however, example embodiments are not limited thereto. The number of unit structures 140a in the electrically conductive thin film 100a may be adjusted to achieve a desired thickness and/or transmittance of visible light. Each unit structure 140a may have a length that is greater than 0 nm and less than about 500 µm and/or greater than 10 nm and less than 10 µm, but example embodiments are not limited thereto.

In example embodiments, the electrically conductive thin film 100a based on the layered crystal structure of the compound may have a repeating unit structure in each unit structure 140a. Each unit structure 140a of the layered crystal structure may be defined by two layers of metal atoms and one layer of anionic elements (e.g., one layer of nitrogen atoms, a layer of oxygen atoms, a layer of halogen atoms, or the like) therebetween. The transparent electrically conductive film 100a including such a compound may have a two-dimensional electron gas layer being present between the unit structures 140a of repeating unit structures. Examples of the compounds having such a layered crystal structure may include a transition metal subfluoride such as $Ag_2F$, an alkali earth metal subnitride such as $Sr_2N$ and $Ba_2N$, a transition metal subcarbide such as $Y_2C$ and Nb2C, and a transition metal suboxide such as $Ti_2O$.

A portion I of the electrically conductive film 100a in FIG. 14A may correspond to the crystal structure of $Ba_2N$, which is illustrated in FIG. 1 of the present application. As shown in FIG. 1 of the present application, the layered crystal structure of the $Ba_2N$ includes a repeating unit structure having two layers of the Ba atoms and one layer of the nitrogen atoms therebetween, and the two-dimensional electron gas layer is present between the unit structures having repeating unit structures. The repeating unit structure is believed to be bonded by an electrostatic force and the bonding energy between the repeating unit structures may be less than or equal to about 100 meV/Å$^2$, for example, less than or equal to about 60 meV/Å$^2$. FIG. 1 is a non-limiting example and the unit structures 140a in the electrically conductive thin film 100a according to example embodiments may alternatively be formed of a different one of the compounds having two layers of metal atoms and one layer of anionic elements (e.g., one layer of nitrogen atoms) therebetween.

Figure 14B:
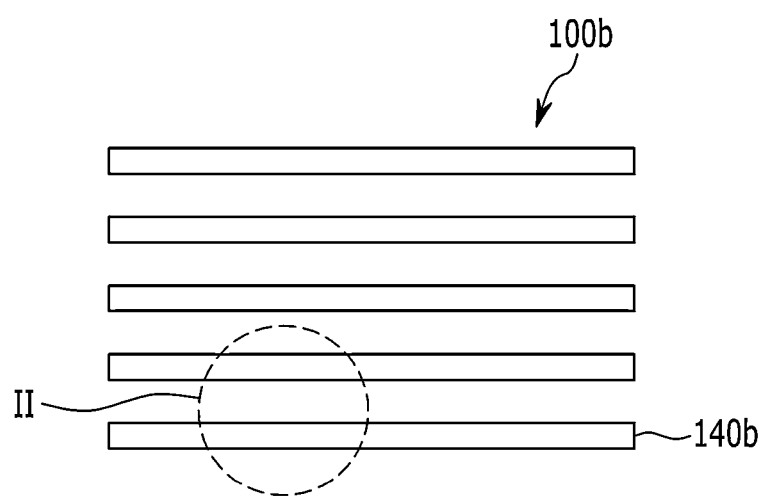

Referring to FIG. 14B, according to example embodiments, an electrically conductive thin film 100b may be based on a layered crystal structure of the compound including a plurality of unit structures 140b stacked on top of each other, where each unit structure 140b may have a repeating unit structure including three parallel layers of metal atoms and anionic elements (e.g., one layer of nitrogen atoms) are distributed between the metal layers.

Although FIG. 14B illustrates an electrically conductive thin film 100b with five unit structures 140b stacked on top of each other, example embodiments are not limited thereto. For example, the electrically conductive thin film 100b may have a thickness that is greater than 0 nm and less than or equal to about 100 nm, and/or a thickness that is greater than 0 nm and less than or equal to 5 nm; however, example embodiments are not limited thereto. The number of unit structures 140b in the electrically conductive thin film 100b may be adjusted to achieve a desired thickness and/or transmittance of visible light. Each unit structure 140b may have a length that is greater than 0 nm and less than about 500 μm and/or greater than 10 nm and less than 10 μm, but example embodiments are not limited thereto. The electrically conductive thin film 100b may be transparent.

Figure 2:
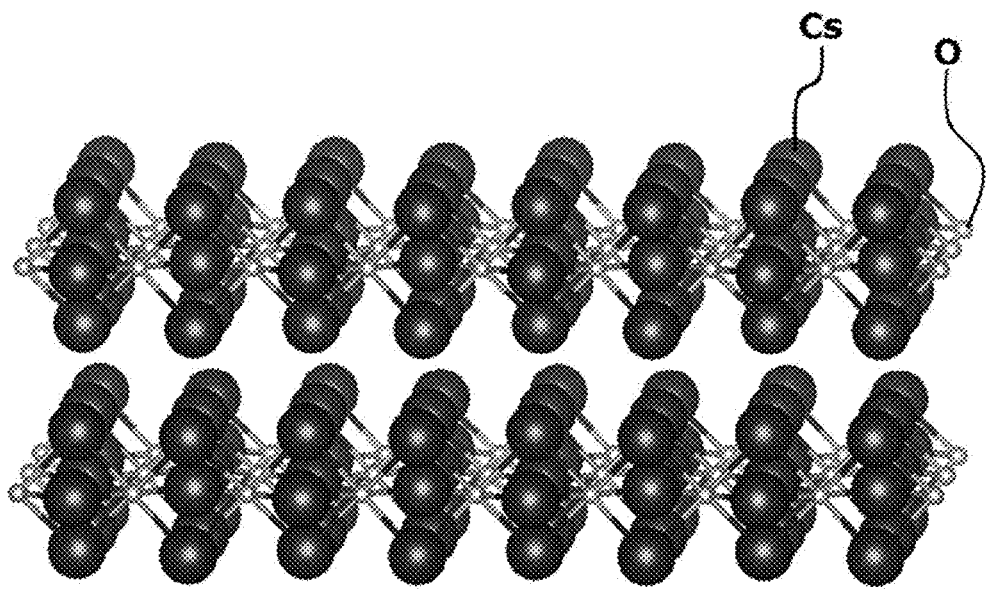
FIG. 2 is a view schematically illustrating a crystal structure of $Cs_3O$.

By way of an non-limiting example, a portion II of the electrically conductive film 100b in FIG. 14B may correspond to the crystal structure of $Cs_3O$, which is illustrated in FIG. 2 of the present application. As shown in FIG. 2, the layered crystal structure of the $Cs_3O$ includes a repeating unit structure wherein three layers of the Cs atoms exist and oxygen atoms are present adjacent to the Cs atoms constituting the middle layer of the Cs atoms.

The transparent electrically conductive film including such a compound may have a two-dimensional electron gas layer being present between the unit structures 140b having repeating unit structures. Examples of the compounds having such a layered crystal structure may include an alkali metal suboxide such as $Cs_3O$ and an alkaline earth metal subnitride such as $Ba_3N$. The repeating unit structure is believed to be bonded by an electrostatic force and the bonding energy between the repeating unit structures may be less than or equal to about 100 meV/Å2, for example, less than or equal to about 60 meV/Å2.

FIG. 2 is a non-limiting example and the unit structures 140b in the electrically conductive thin film 100b according to example embodiments may alternatively be formed of a different one of the compounds have a repeating unit structure including three parallel layers of metal atoms and one layer anionic elements (e.g., one layer of nitrogen atoms) distributed therebetween.

Figure 14C:
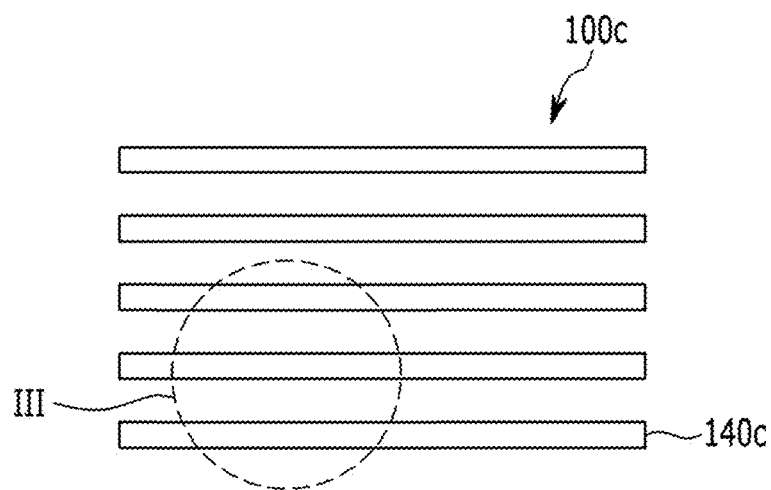

Referring to FIG. 14C, according to example embodiments, an electrically conductive thin film 100c may be based on a layered crystal structure of the compound including a plurality of unit structures 140c stacked on top of each other, where each unit structure 140c may have a repeating unit structure which includes a top layer and a bottom layer include chalcogen atoms and at least two (e.g., three to five) layers of transition metal atoms therebetween.

Although FIG. 14C illustrates an electrically conductive thin film 100c with five unit structures 140c stacked on top of each other, example embodiments are not limited thereto. For example, the electrically conductive thin film 100c may have a thickness that is greater than 0 nm and less than or equal to about 100 nm, and/or a thickness that is greater than 0 nm and less than or equal to 5 nm; however, example embodiments are not limited thereto. The number of unit structures 140c in the electrically conductive thin film 100c may be adjusted to achieve a desired thickness and/or transmittance of visible light. Each unit structure 140c may have a length that is greater than 0 nm and less than about 500 μm and/or greater than 10 nm and less than 10 μm, but example embodiments are not limited thereto. The electrically conductive thin film 100c may be transparent.

Figure 3:
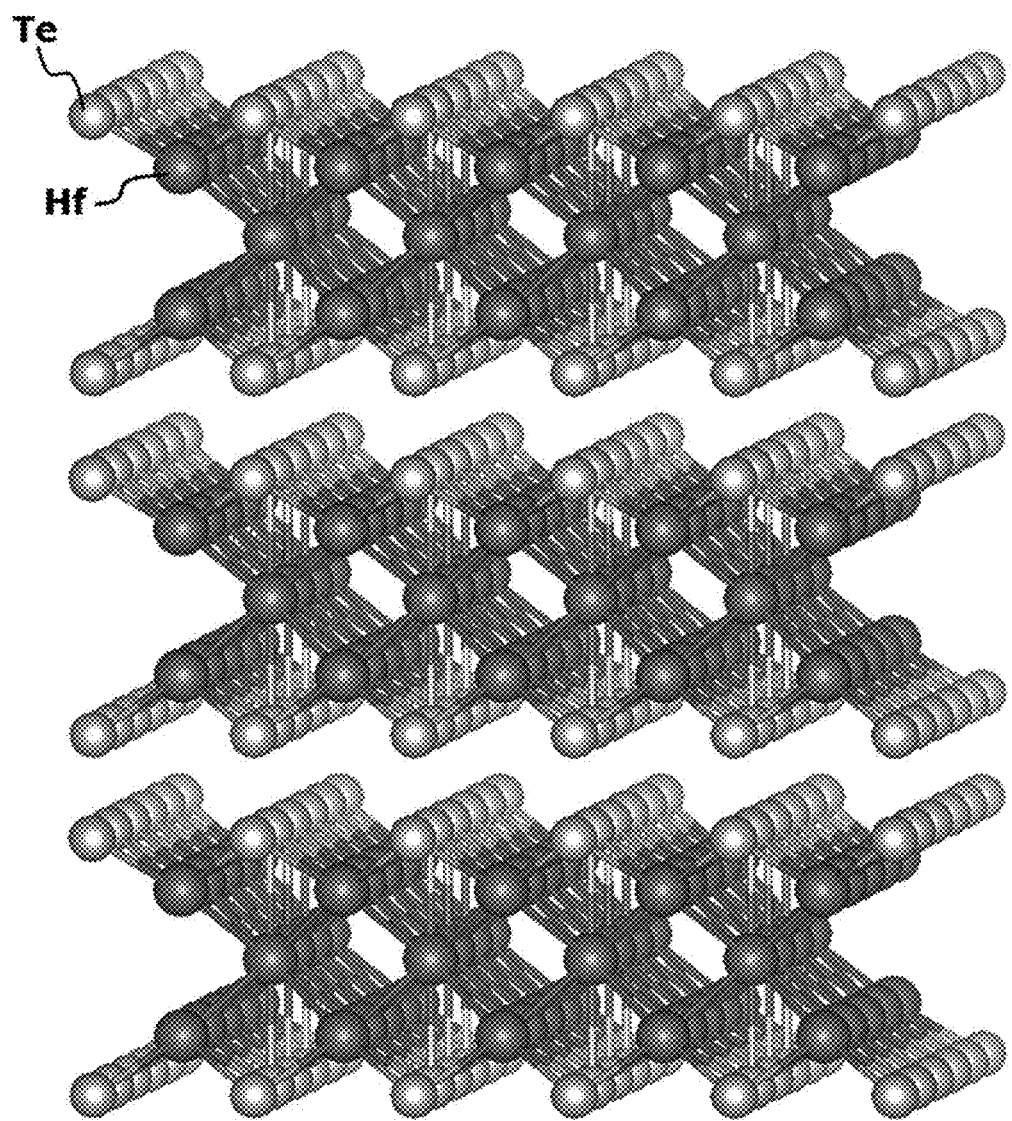
FIG. 3 is a view schematically illustrating a crystal structure of $Hf_3Te_2$.

As a non-limiting example, a portion III of the electrically conductive thin film 100c may correspond to the crystal structure of $Hf_3Te_2$, which is illustrated in FIG. 3 of the present application, but example embodiments are not limited thereto. For $Hf_3Te_2$, as shown in FIG. 3 of the present application, the repeating unit structure may have a total of five atomic layers, among which the top and bottom atomic layers are Te atoms and the middle three atomic layers are Hf atoms. A two-dimensional electron gas layer may be present within the unit structure (e.g., between the layers of Hf atoms), and each repeating unit structure may be bonded via van der Waals force.

Figure 14D:
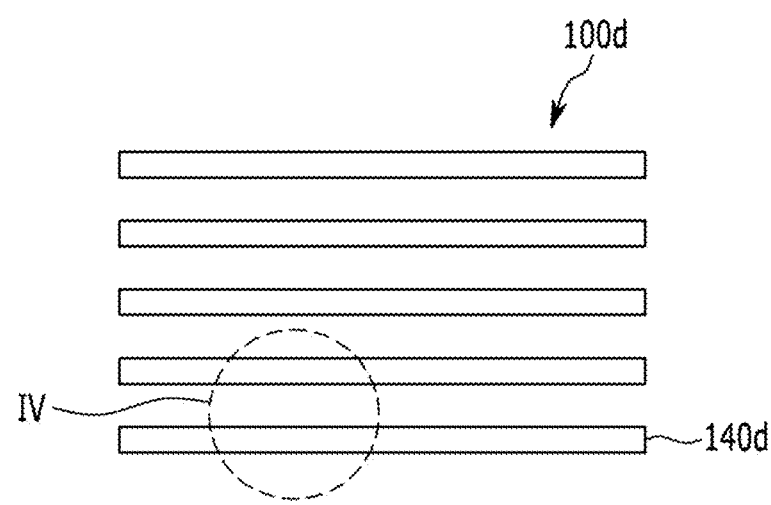

Referring to FIG. 14D, according to example embodiments, an electrically conductive thin film 100d may be based on a layer crystal structure of the compound including a plurality of unit structures 140d stacked on top of each other, where each unit structure 140d includes a top layer and a bottom layer consisting of chalcogen atoms (e.g., S, Se, Te) and four layers of transition metal atoms therebetween.

Although FIG. 14D illustrates an electrically conductive thin film 100d with five unit structures 140d stacked on top of each other, example embodiments are not limited thereto. For example, the electrically conductive thin film 100d may have a thickness that is greater than 0 nm and less than or equal to about 100 nm, and/or a thickness that is greater than 0 nm and less than or equal to 5 nm; however, example embodiments are not limited thereto. The number of unit structures 140d in the electrically conductive thin film 100d may be adjusted to achieve a desired thickness and/or transmittance of visible light. Each unit structure 140d may have a length that is greater than 0 nm and less than about 500 µm and/or greater than 10 nm and less than 10 µm, but example embodiments are not limited thereto. The electrically conductive thin film 100*d* may be transparent.

Figure 4:
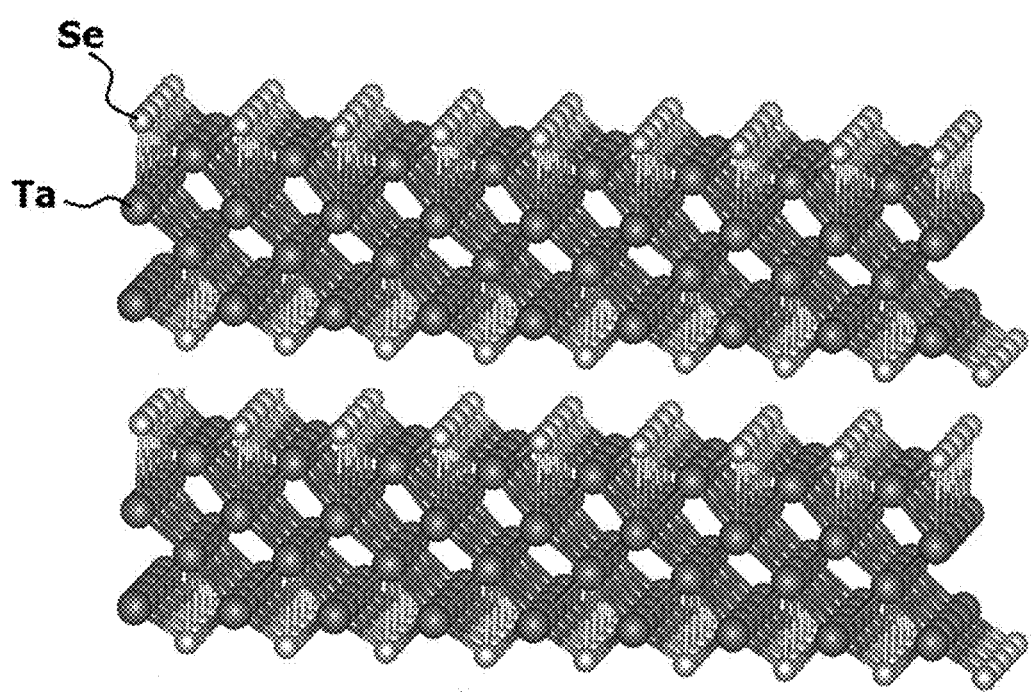
FIG. 4 is a view schematically illustrating a crystal structure of $Ta_2Se$.

As a non-limiting example, a portion IV of the electrically conductive thin film 100*d* may correspond to the crystal structure of $Ta_2Se$, which is illustrated in FIG. 4 of the present application, but example embodiments are not limited thereto. For $Ta_2Se$, as shown in FIG. 4 of the present application, the repeating unit may include six atomic layers. Each of the top and bottom atomic layers is a layer of Se atoms. The middle four layers are layers of Ta atoms. The two-dimensional electron gas layer may be present within the unit structure (e.g., between the layers of Ta atoms) and each repeating unit structure may be bonded via the van der Waals force.

Figure 14E:
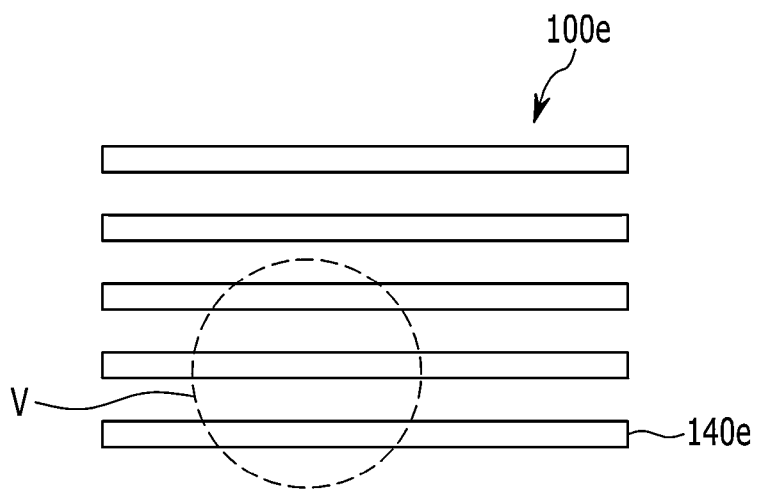

Referring to FIG. 14E, according to example embodiments, an electrically conductive thin film 100*e* may be based on a layered crystal structure of the compound including a plurality of unit structures 140*e* stacked on top of each other, where each unit structure 140*e* includes a top layer and a bottom layer consisting of chalcogen atoms (e.g., S, Se, Te) and five layers of transition metal atoms therebetween.

Although FIG. 14E illustrates an electrically conductive thin film 100*e* with five unit structures 140*e* stacked on top of each other, example embodiments are not limited thereto. For example, the electrically conductive thin film 100*e* may have a thickness that is greater than 0 nm and less than or equal to about 100 nm, and/or a thickness that is greater than 0 nm and less than or equal to 5 nm; however, example embodiments are not limited thereto. The number of unit structures 140*e* in the electrically conductive thin film 100*e* may be adjusted to achieve a desired thickness and/or transmittance of visible light. Each unit structure 140*e* may have a length that is greater than 0 nm and less than about 500 µm and/or greater than 10 nm and less than 10 µm, but example embodiments are not limited thereto. The electrically conductive thin film 100*e* may be transparent.

Figure 5:
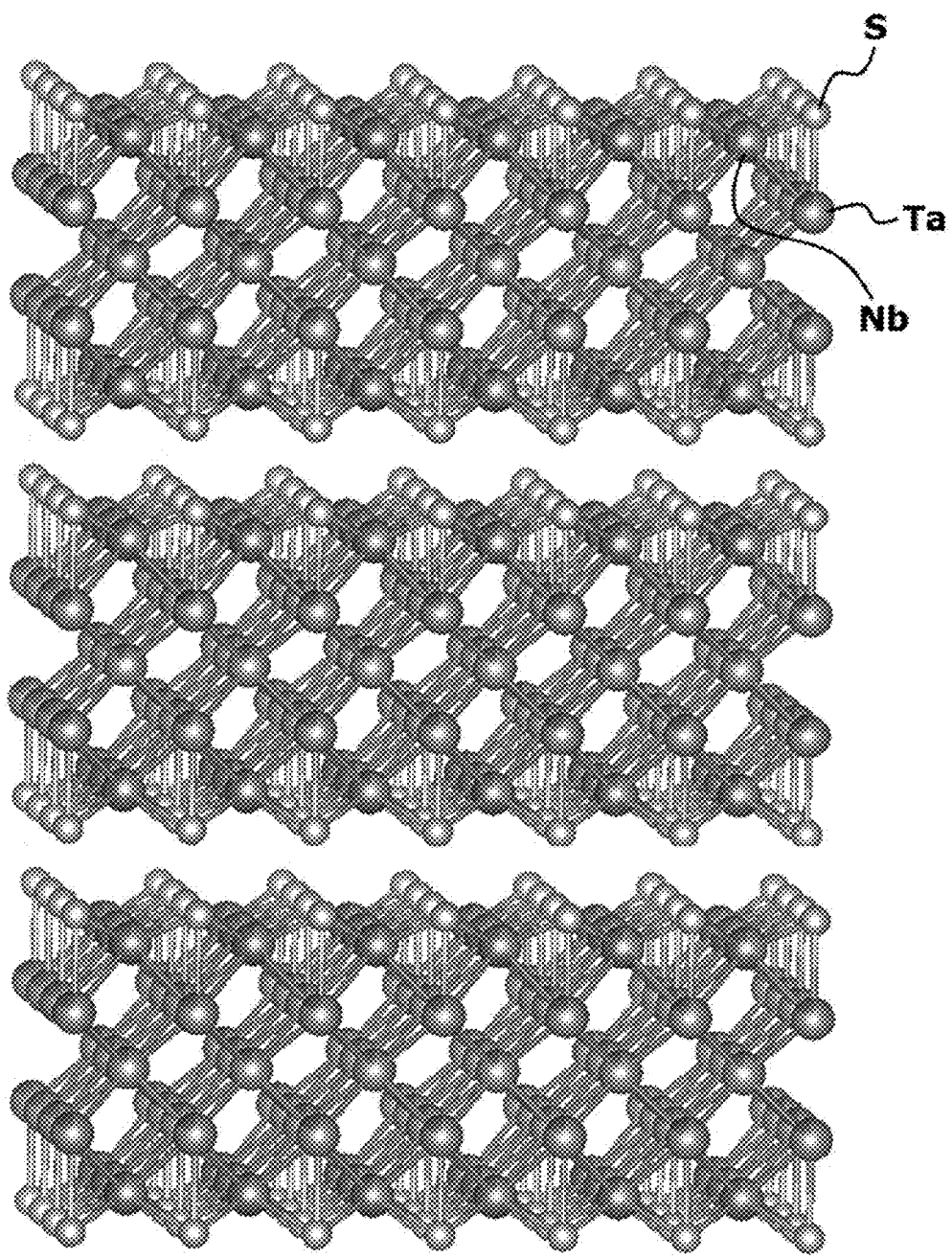
FIG. 5 is a view schematically illustrating a crystal structure of $(Ta, Nb)_5S_2$.

As a non-limiting example, a portion V of the electrically conductive thin film 100*e* may correspond to the crystal structure of $(Ta,Nb)_5S_2$, which is illustrated in FIG. 5 of the present application. As illustrated in FIG. 5 of the present application, the layered crystal structure of $(Ta,Nb)_5S_2$ may have a repeating unit structure including seven layers. Each of the top and bottom layers is a layer of S atoms and the middle five layers are layers of Ta atoms or layers of Nb atoms. The two-dimensional electron gas layer may be present within the unit structure (e.g., between the layers of Ta/Nb atoms) and each repeating unit structure is bonded via the van der Waals force. Therefore, the bonding energy between the repeating unit structures is very low and may be less than or equal to about 100 meV/Å$^2$, for example, less than or equal to about 10 meV/Å$^2$.

Figure 14F:
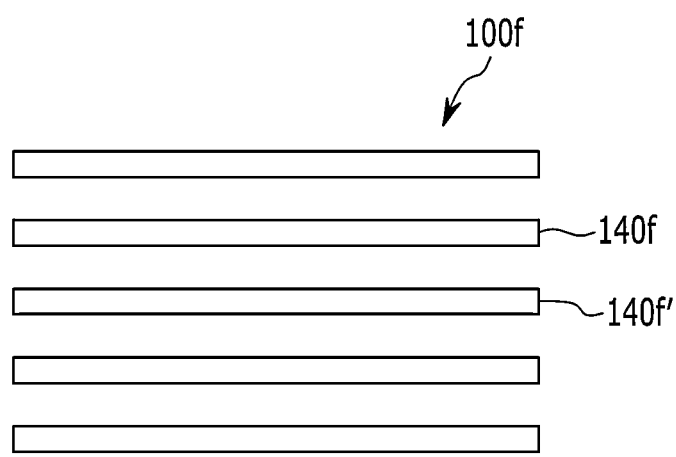

Referring to FIG. 14F, according to example embodiments, an electrically conductive thin film 100*f* may include a plurality of layers stacked on top of each other. Each unit structure may include a nanosheet of one of the aforementioned compounds and may have a repeating unit structure. For the electrically conductive thin film 100*f* shown in FIG. 14F, the unit structures 140*f* and 140*f'* may be formed of different ones of the aforementioned compounds.

Electrically conductive thin films according to example embodiments include a plurality of unit structures stacked on top of each other and may be formed of the above-described compounds having a layered crystal structure. Electrically conductive thin films according to example embodiments may include two-dimensional electron gas layers, and may show electrical conductivity as high as a pure metallic material together with high transparency. Moreover, in example embodiments, electrically conductive thin films may have excellent flexibility as the unit structure layers may slide therebetween in the layered crystal structure.

Figure 12:
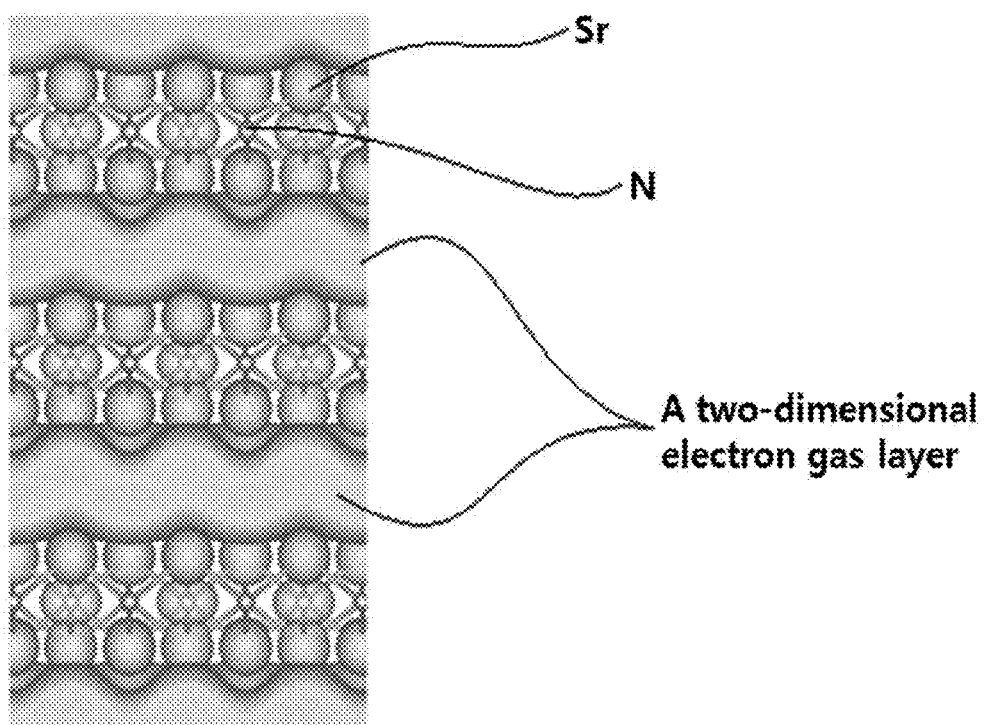
FIG. 12 is a view showing the charge distribution of $Sr_2N$, which is calculated via a simulation process and confirms the presence of the two-dimensional electron gas layer.
Figure 13:
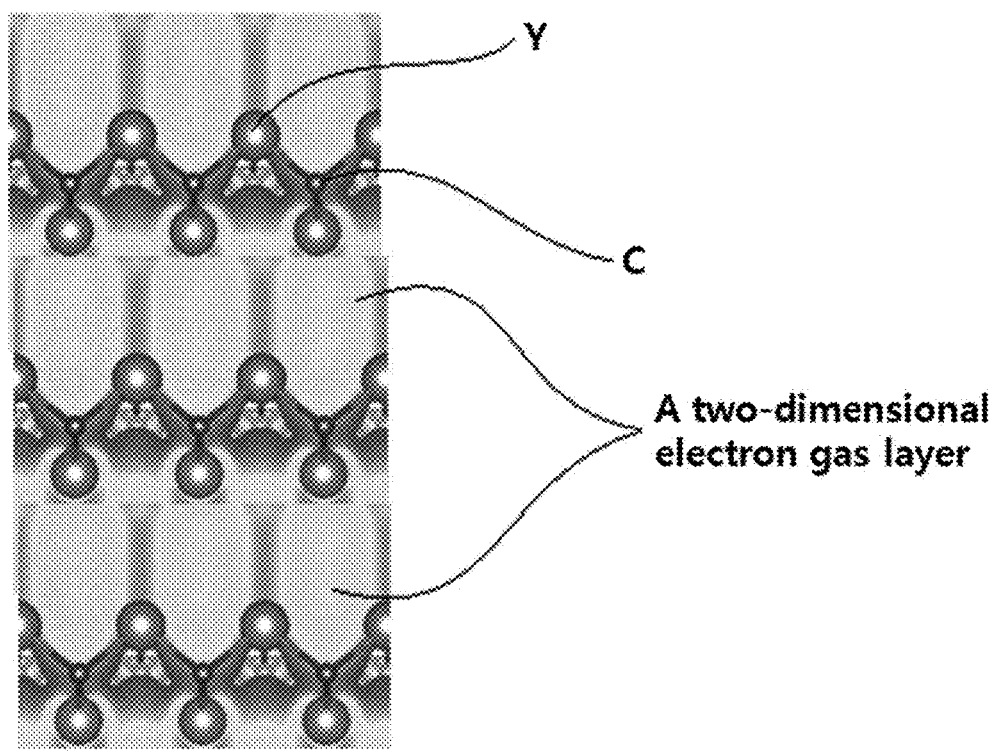
FIG. 13 is a view showing the charge distribution of $Y_2C$, which is calculated via a simulation process and confirms the presence of the two-dimensional electron gas layer.

The two-dimensional electron gas layer included in the compound (i.e., in the electrically conductive thin films according to example embodiments) may be confirmed by the charge distribution of the given compound (e.g., the electron configuration in the atomic model of the compound) calculated by the simulation process. The simulation representing the charge distribution is carried out the method known in the art (see Proc. R. Soc. A (2011) 467, 2066-2083). FIG. 12 and FIG. 13 show the charge distribution of strontium subnitride ($Sr_2N$) and yttrium subcarbide ($Y_2C$) obtained from the simulation. FIG. 12 and FIG. 13 confirm that these compounds have the two-dimensional electron gas layer.

The compound has conductivity that may be measured by Hall effect measurement due to the presence of the two-dimensional electron gas layer. The conductivity may be calculated from the electron concentration and the charge mobility. Due to the presence of the two-dimensional electron gas layer, the aforementioned compounds may exhibit behaviors in light of conductivity that are similar to the metal. For example, as a temperature increases, scattering between electrons or scattering between the electrons and the interstices become more serious, and thus the aforementioned compounds may show higher resistance and lower conductivity.

Various researches have been made to develop a flexible transparent electrode material having high electrical conductivity and being transparent in the visible radiation range. Metals may have high electron density and high electrical conductivity. However, a metal thin film tends to react with oxygen in air to form an oxide on its surface, and such an oxidation phenomenon becomes more serious except with some precious metals such as Au, Ag, and Pt. Therefore, a metal-based electrode material or a conducting nanofiller material has disadvantages of considerably high contact resistance. In addition, the metallic material should have a decreased thickness in order to increase light transmittance (e.g., to secure the transparency), but when the thickness of the metal film decreases (for example, at a thickness of less than or equal to about 50 nm), the metal shows sharply increased sheet resistance. In addition, when the thickness of the metal film decreases to 10 nm or less, surface scattering of the electrons may cause decreased charge mobility and higher values of the sheet resistance and resistivity.

There has been another attempt to decrease surface contact resistance by using a ceramic material having a relatively high electrical conductivity and showing a decreased level of the surface oxidation. However, currently available conductive ceramic materials (e.g., ITO) cannot realize high conductivity and they generally show poor flexibility and supply of their raw materials is very unstable, and thus urgent needs to develop alternative materials still remain.

Meanwhile, some transition metal dichalcogenides (e.g., $MX_2$) such as $MoS_2$ have a layered crystal structure but show a low level of electrical conductivity. As a result, it is difficult to use some transition metal dichalcogenides such as $MoS_2$ as a transparent conducting film. For example, the absorption coefficient of $MoS_2$ is about 106/cm in the visible radiation range and the resistivity thereof is about 0.3~30 Ωcm. Therefore, the $MoS_2$ is a type of a semiconductor, and a product of its absorption coefficient and its resistivity is at least about 30,000. In contrast, in example embodiments, electrically conductive thin films may be formed from one of the aforementioned compounds, where a product of an absorption coefficient (α) for light having a wavelength of about 550 nm at 25° C. and specific resistivity (ρ) thereof is less than or equal to about 30 Ω/sq, or less than or equal to about 5 Ω/sq. In comparison, 30,000 Ω/sq for $MoS_2$ is far greater than the 30 Ω/sq in electrically conductive thin films according to example embodiments.

In contrast, although transparent electrically conducting films according to example embodiments include an inorganic material having a metal and a non-metallic element, they includes the two-dimensional electron gas layer in the unit structure layer or between the unit structure layers and thus may exhibit a very high level of conductivity at a very small thickness (e.g., when they are in the form of a very thin film). Without wishing to be bound by any theory, it is believed that the electrically conductive films according to example embodiments may exhibit very high conductivity with high transparency as they include electrons that are two-dimensionally confined in the layered crystal structure, and the electrons in the two-dimensional electron gas layer may move with high mobility even when the film is very thin. In addition, in example embodiments, the electrically conductive film may exhibit high flexibility as the compound included therein has a layered crystal structure.

The layered crystal structure of the aforementioned compounds for electrically conductive thin films according to example embodiments may belong to a trigonal system with a P-3m1 space group, a trigonal system with a R3-MH space group, a tetragonal system with a I4/MMM space group, or a hexagonal system with a P63/mcm space group. The types of the layered crystal structures of the examples of the aforementioned compounds for electrically conductive thin films according to example embodiments are summarized in Table 3 presented below.

The compound may have a product of an absorption coefficient (α) for light having a wavelength of about 550 nm at 25° C. and a resistivity value (ρ) thereof of less than or equal to about 30 Ω/sq, for example, less than or equal to about 20 Ω/sq, less than or equal to about 10 Ω/sq, or less than or equal to about 5 Ω/sq. Herein, the absorption coefficient and the resistivity are obtained from a computer simulation. The resistivity (ρ) is obtained by calculating the density of state (DOS) and the band structure around the Fermi level from the crystal structure of the corresponding rare earth element chalcogenide compounds. In addition, the absorption coefficient (α) for a certain wavelength is calculated from the dielectric constant of the compound that is obtained by applying the Drude model and considering electron transition due to interband transition. As to simulation methodology for providing the absorption coefficient (α) and the resistivity (ρ), it is possible to further refer to the Vienna Ab-initio Simulation Package (written by Georg Kresse and Jurgen Furthmuller, Institut fur Materialphysik, Universitat Wien, Sensengasse 8, A-1130 Wien, Austria, Aug. 24, 2005, http://cms.mpi.univie.ac.at/VASP or http://www.vasp.at), which is incorporated herein by reference in its entirety. The aforementioned simulation procedures can be summarized as in Table 1.

TABLE 1

| Calculation | Simulation level | Calculation/simulation |
|---|---|---|
| Atom electron structure | DFT | Structure optimization<br>Band structure calculation |
| Conductive characteristic | Semi-classical Boltzmann transport (const. τ) | Intraband transition<br>$\sigma \approx (e^2/4\pi^3) \tau \int dk\, v(k)\, v(k)\, (-\partial f/\partial \varepsilon) = ne^2 \tau/m_{eff} = ne\, \mu$<br>$\rho = 1/\sigma$ |
| Dielectric characteristic | DFPT + Drude model | Interband transition<br>$\varepsilon(\omega) = \varepsilon_D(\omega) + \varepsilon_B(\omega) = \varepsilon_1(\omega) + i\varepsilon_2(\omega)$ |
| Optical characteristic Calculate ρ α | Ray optics | $n(\omega) + i\, k(\omega) = \varepsilon(\omega)^{1/2}$<br>Absorption coeff. $\alpha = 4\pi k/\lambda$ |

DFT: density-functional theory
DFPT: density-functional perturbation theory
Drude model: free electron model for a solid
σ, τ, $m_{eff}$, μ, ρ: electrical conductivity, relaxation time, effective mass, mobility, resistivity
$(\omega)_p$ $(\omega_p')$: (screened) plasma frequency Hereinbelow, the description of Table 1 is explained in further detail.

In order to calculate a quantum mechanical state of a material, the first-principles calculation (a calculation made from a fundamental equation without using extrinsic parameters) based on the density-functional-theory (DFT) method (a method of solving a quantum mechanical equation by describing the electron distribution using an electron density function instead of a wave function) is performed to calculate the quantum mechanical state of an electron. The VASP (the Vienna Ab initio simulation package code, which is the first principle DFT code) is used to calculate the electron state. A candidate material group including a two-dimensional electron gas layer is selected from the Inorganic Crystal Structure Database (ICSD). The atomic structure information for the candidate material is input and the energy level of the electrons is calculated by simulation, and for such electrons, an energy density function and a state density function on a k-space of the electrons are calculated.

The electron structure calculated through the DFT computer simulation provides an E-k diagram (the band structure) and DOS (Density of State: electron state density, electron state density function per energy unit) information, making it possible to determine whether the given material is a metallic conductive material ($DOS(E_F)>0$) or a semiconductor material ($DOS(E_F)=0$) depending on the presence of the DOS on the maximum energy level ($E_F$) available to the electrons.

Figure 6:
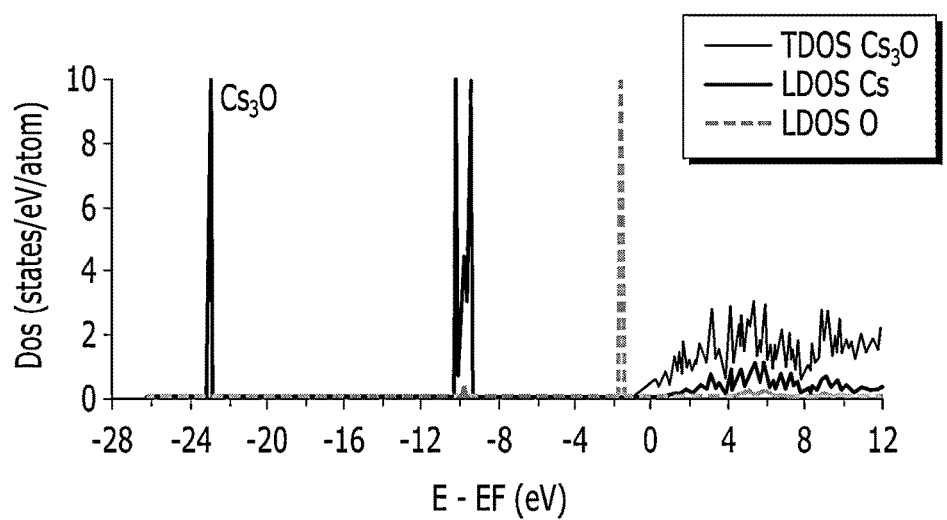
FIG. 6 is a view schematically illustrating a density of state (DOS) of $Cs_3O$.

FIG. 6 shows the results of the DOS calculation for the $Cs_3O$ material, which confirms that the material has a positive value of the DOS at a position of $E_F$ (E=0), and thus it is a metallic conducting material. Through the foregoing calculation of the electron structure, materials having metallic conductivity are selected first among the candidate materials having the two-dimensional electron gas layer, and for these selected materials, the electrically conducting properties and the transmittance properties thereof are calculated.

Calculation of Conductivity Through Semi-Classical Boltzmann Transport Model

In order to predict the conductivity (σ) of a metallically conducting material, its conductive characteristics are estimated by introducing a semi-classical Boltzmann transport model. In this case, relaxation time of electrons (τ: duration during which an electron can move without collision) is assumed to be constant (see Ashcroft and Mermin, Solid State Physics).

Boltzmann-Transport $$\sigma = (e^2/4\pi^3)\tau \int dk\, v(k) v(k) (-\partial f/\partial E)$$

Herein, $\tau$ is a relaxation time of an electron, k is a state of the electron in the k-space, v(k) is a speed of the electron in the k state, f is the Fermi-Dirac distribution function, and E is energy.

Figure 7:
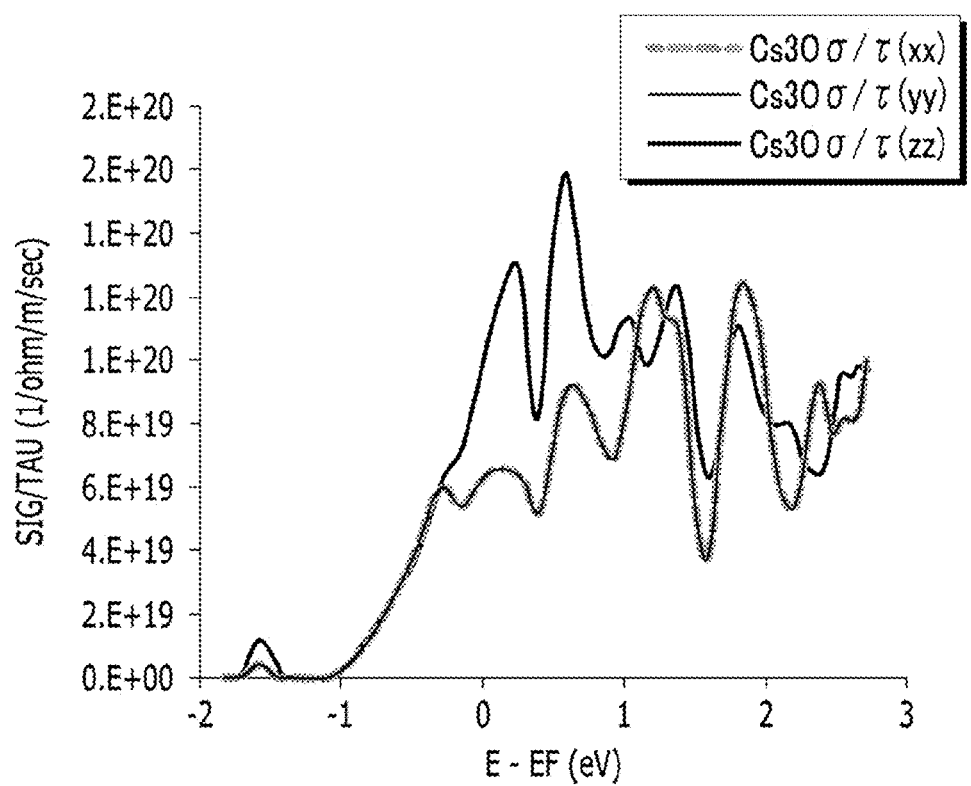
FIG. 7 is a view showing the calculation results of the conductivity of $Cs_3O$.

In this case, v(k) may be calculated from the E-k diagram, and $\sigma/\tau$ may be obtained from the above formula. The results are shown in FIG. 7.

Calculation of Transmittance Using DFPT+Drude Model

The mechanism determining the transmittance absorption of the conductive material may include intraband absorption due to plasma-like oscillation of free electrons and intraband absorption due to band-to-band transition of bound electrons. The quantum computational simulation process considering each of the mechanisms may be obtained by the process as set forth in Table 2 entitled "Simulation table for Optical Properties" (see Ashcroft and Mermin, Solid State Physics).

TABLE 2

| STEP | Category | Calculation | Results | Method (tool) |
|---|---|---|---|---|
| 8 | Optical simulation | Interband transition | εB(w) = εB1(w) + i ε B2(w) | DFT (VASP) |
| 9 | Optical simulation | Plasma frequency intraband transition | ε D(w) = ε D1(w) + i ε D2(w) | Boltzmann transport DFT (VASP) or post-processing |
| 10 | Optical simulation | Total dielectric constant refractive index | | Post-processing |
| 11 | Optical simulation | Reflectance absorption coefficient | Plasma freq. reflectance absorption co. transmittance | Post-processing |

Herein, B denotes a band, and D denotes a Drude model. In this case, the relationships of the dielectric constant ($\varepsilon$), the refractive index (n), and the absorption coefficient ($\alpha$) of a solid are shown as follows. For the dielectric constant, both the interband transition related portion ($\varepsilon$(Band)) and the intraband transition related portion ($\varepsilon$(Drude)) should be considered.

$$\varepsilon(\omega) = \varepsilon_{(Drude)} + \varepsilon_{(Band)}$$

$$= \varepsilon_1(\omega) + i\varepsilon_2(\omega) \quad \text{dielectric function}$$

$$(n + ik)^2 = \varepsilon(\omega) \quad \text{refraction function}$$

$$\alpha(\omega) = 4\pi k/\lambda \quad \text{absorption coefficient}$$

As set forth in the above conductivity calculation, the interband absorption may be calculated through the band structure as calculated in advance while the intraband absorption by the free electrons is calculated by the simulation as below through the conductivity and optical coefficient calculation based on the Drude modeling (see Jinwoong Kim, Journal of Applied Physics 110, 083501 (2011), which is hereby incorporated by reference in its entirety).

CGS UNIT $$\sigma(\omega) = \sigma_0/[1 - i\omega\tau] \quad \text{AC conductivity}$$

$$\sigma_0 = ne^2\tau/m \quad \text{DC conductivity}$$

$$\varepsilon(\omega) = 1 + i(4\pi/\omega)\sigma(\omega)$$

$$\omega_p^2 \tau = \sigma_0/\varepsilon_0 \quad (si)$$

$$= 4\pi\sigma_0 \quad (cgs)$$

$$\varepsilon(\omega) = 1 + i(4\pi/\omega)\sigma_0/[1 - i\omega\tau] = 1 - (4\pi\sigma_0/\omega)/[i + \omega\tau]$$

$$= 1 - (\omega_p\tau)^2/[1 + (\omega\tau)^2] + i(\omega_p\tau)^2/[\omega\tau(1 + (\omega\tau)^2)]$$

$$\epsilon_1 = 1 - \frac{\omega_p^2 \tau^2}{1 + \omega^2\tau^2} \quad n = \frac{1}{\sqrt{2}}\left(\epsilon_1 + (\epsilon_1^2 + \epsilon_2^2)^{1/2}\right)^{1/2}$$

$$\epsilon_2 = \frac{\omega_p^2 \tau^2}{\tau\omega(1 + \omega^2\tau^2)} \quad \kappa = \frac{1}{\sqrt{2}}\left(-\epsilon_1 + (\epsilon_1^2 + \epsilon_2^2)^{1/2}\right)^{1/2}$$

$\omega$: frequency $\omega_p$: plasma frequency k: extinction coefficient

Figure 8:
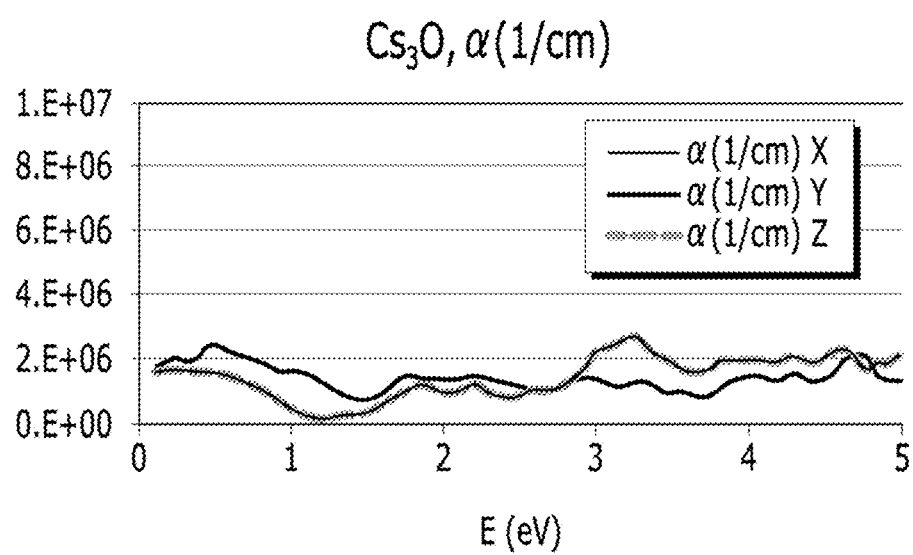
FIG. 8 is a view showing the calculation results of the absorption coefficient of $Cs_3O$.

As set forth in the above, the calculation of the interband absorption and the intraband absorption makes it possible to calculate the dielectric function of the given material, and the optical constants thereof can be simulated therefrom. In the end, the reflectance (R), the absorption coefficient ($\alpha$), and the transmittance (T) of the given material can be calculated therefrom. The results of calculating the absorption coefficient for $Cs_3O$ are shown in FIG. 8.

In case of the aforementioned compounds included in the transparent electrically conductive film according to example embodiments, the product of the absorption coefficient ($\alpha$) and the resistivity ($\rho$) may be less than or equal to about 30 $\Omega$/sq, for example, less than or equal to about 20 $\Omega$/sq, less than or equal to about 10 $\Omega$/sq, or less than or equal to about 5 $\Omega$/sq. By way of an example, the product of the absorption coefficient ($\alpha$) (e.g., for light having a wavelength of about 550 nm at 25° C.) and the resistivity ($\rho$) for some compounds are compiled in Table 3 as below.

TABLE 3

| | Crystal structure | $\rho$ ($\Omega$/cm) | $\alpha$ (1/cm) | $\rho\alpha$ |
|---|---|---|---|---|
| $Ag_2F$ | P-3m1 (164), trigonal | 1.75E−06 | 1.62E+05 | 0.28 |
| $Cs_3O$ | P63/mcm (193), hexagonal | 1.01E−05 | 1.22E+05 | 1.24 |
| $Hf_3Te_2$ | I4/MMM (139), tetragonal | 4.15E−06 | 3.72E+05 | 1.54 |
| $Sr_2N$ | R3-MH (166), trigonal | 5.68E−06 | 2.97E+05 | 1.69 |
| $(Ta,Nb)_5S_2$ | I4/MMM (139), tetragonal | 3.65E−06 | 6.90E+05 | 2.52 |
| $Y_2C$ | R3-MH (166), trigonal | 7.49E−06 | 3.61E+05 | 2.70 |
| $Ti_2O$ | P-3m1 (164), trigonal | 5.61E−06 | 6.29E+05 | 3.53 |
| $Ba_2N$ | R3-MH (166), trigonal | 8.78E−06 | 4.15E+05 | 3.64 |
| $Nb_2C$ | R3-MH (166), trigonal | 5.52E−06 | 6.74E+05 | 3.72 |
| $Ba_3N$ | P63/mcm (193), hexagonal | 1.34E−05 | 2.88E+05 | 3.86 |
| $Ta_2Se$ | I4/MMM (139), tetragonal | 7.72E−06 | 5.47E+05 | 4.23 |

The product of resistivity ($\rho$) and absorption coefficient ($\alpha$) may represent the product of sheet resistance ($R_s$) and transmittance (lnT) according to the following equation. Accordingly, compounds having a lower value of $\rho*\alpha$ may be advantageous for a material of electrically conductive thin films according to example embodiments.

$e^{-\alpha t} = T$ (e.g., $\alpha t = -\ln T$)

$R_s = \rho/t$

Figure 9:
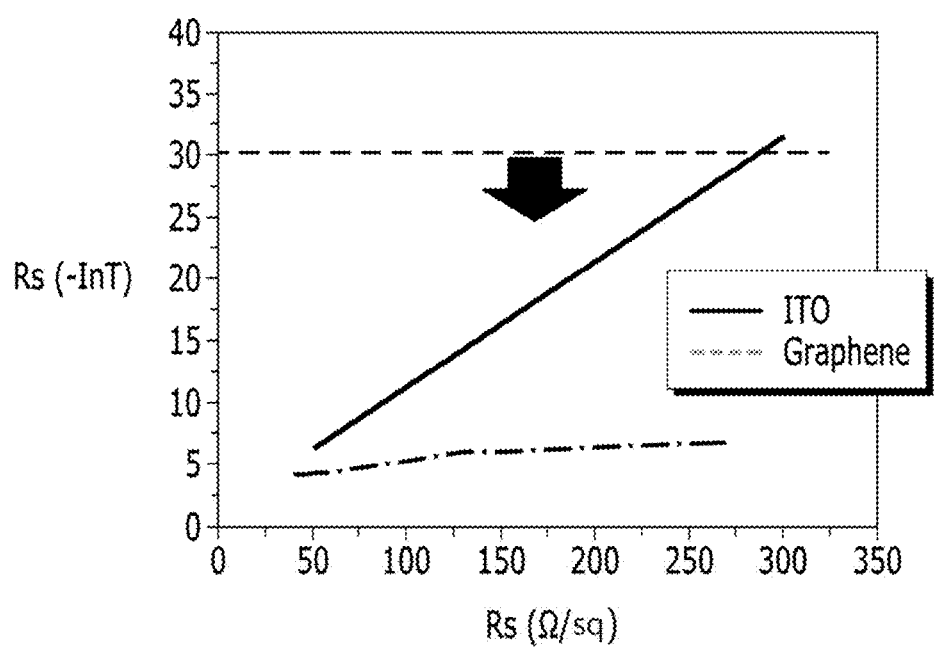
FIG. 9 includes graphs of a product of sheet resistance and light transmittance versus changes of the sheet resistance for ITO and graphene.

∴ $\rho*\alpha = R_s*(-\ln T)$

α: absorption coefficient
ρ: resistivity
T: transmittance (at λ=550 nm)
t: thickness
Rs: sheet resistance Generally, in order to increase the transmittance of the transparent electrode, the amount of the conductive filler should be decreased or the thickness of the electrode should be smaller, and this may cause an increase in the sheet resistance ($R_s$). FIG. 9 shows a graph wherein, for ITO and graphene, the value of $R_s*(-\ln T)$ that can be used as a transparent electrode in the form of a continuous film is plotted with respect to the $R_s$. The results of FIG. 9 confirm that the ITO and the graphene cannot have a value of $R_s*(-\ln T)$ of less than or equal to about 5. Meanwhile, graphene may have a theoretical value of conductivity, but a thin film including graphene tends to have many defects so that the actual conductivity of graphene may be very low and the actual absorption of the visible radiation for graphene may be very high. Therefore, in practice, graphene may be undesirable as a transparent electrode.

In contrast, the compound included in transparent electrically conductive films according to example embodiments may have a product of the absorption coefficient and the resistivity ($\rho*\alpha$) of less than or equal to about 30 Ω/sq, for example, less than or equal to about 20 Ω/sq, less than or equal to about 10 Ω/sq, or less than or equal to about 5 Ω/sq. Therefore, electrically conductive films according to example embodiments may provide a transparent conductive thin film having high conductivity and excellent transparency (e.g., low sheet resistance and high light transmittance).

When the product of the absorption coefficient and the resistivity is less than or equal to about 30, the highest value of the sheet resistance may vary with the transmittance as shown in Table 4.

TABLE 4

| T (%) | Rs (Ω/sq) |
|---|---|
| 60 | Less than or equal to about 58.7 |
| 65 | Less than or equal to about 69.6 |
| 70 | Less than or equal to about 84.1 |
| 75 | Less than or equal to about 104.3 |
| 80 | Less than or equal to about 134.4 |
| 85 | Less than or equal to about 184.6 |
| 90 | Less than or equal to about 284.7 |
| 95 | Less than or equal to about 584.9 |
| 99 | Less than or equal to about 2985.0 |

In example embodiments, a transparent electrically conductive film may be prepared as a continuous deposited film via vapor deposition of one of the aforementioned compounds or raw materials thereof. The vapor deposition may be carried out by a physical vapor deposition method such as thermal evaporation and sputtering, chemical vapor deposition (CVD), atomic layer deposition (ALD), or pulsed laser deposition (PLD). The deposition may be performed using any known or commercially available apparatus. The raw materials and the deposition conditions may vary with the types of the compound and the deposition method, but are not particularly limited. For example, the raw material may be an elemental powder or a compound thereof including the elements constituting the given compound or a mono- or polycrystalline sintered body thereof, but it is not limited thereto.

According to example embodiments, a bulk material including one of the aforementioned compounds (e.g., a monocrystalline or polycrystalline sintered body of the aforementioned compound) or a pulverized powder thereof may be subjected to liquid phase exfoliation to produce a plurality of nanosheets, which are then brought into contact with each other so as to provide an electrical connection, providing an electrically conductive thin film. The aforementioned compounds may have binding energy between unit structures thereof that may be less than or equal to about 100 meV/Å$^2$ in its layered crystal structure, and thus the bulk material or a powder thereof may be prepared as a nanosheet including one or at least two unit structure layers in a suitable manner such as liquid phase exfoliation. In the liquid phase exfoliation, the bulk material or the powder thereof may be subjected to ultrasonication in an appropriate solvent. Examples of the solvent suitable for the liquid phase exfoliation may include, but are not limited to, water, alcohol (isopropyl alcohol, ethanol, or methanol), N-methyl pyrrolidone (NMP), hexane, benzene, dichlorobenzene, toluene, chloroform, diethylether, dichloromethane (DCM), tetrahydrofuran (THF), ethyl acetate (EtOAc), acetone, dimethyl formamide (DMF), acetonitrile (MeCN), dimethyl sulfoxide (DMSO), ethylene carbonate, propylene carbonate, γ-butyrolactone, γ-valerolactone, a perfluorinated aromatic solvent (e.g., hexafluorobenzene, octafluorotoluene, pentafluorobenzonitrile, and pentafluoropyridine), or a combination thereof.

An additive such as a surfactant may be added to the solvent in order to facilitate the exfoliation and limit (and/or prevent) the exfoliated nanosheets from being agglomerated. Examples of the surfactant may include, but are not limited to, sodium dodecyl sulfate (SDS) and sodium dodecyl benzenesulfonate (SDBS). The ultrasonication may be performed by using any conventional or commercially available ultrasonication device, and the conditions thereof (e.g., ultrasonication time) are not particularly limited, but may be appropriately selected considering a solvent used and a powder concentration in the solvent. For example, the ultrasonication may be performed for greater than or equal to about 1 hour, for example, for about 1 hour to about 100 hours, but is not limited thereto. The powder concentration in the solvent may be greater than or equal to about 0.01 g/ml, for example, within a range from about 0.01 g/ml to about 10 g/ml, but is not limited thereto.

Figure 15:
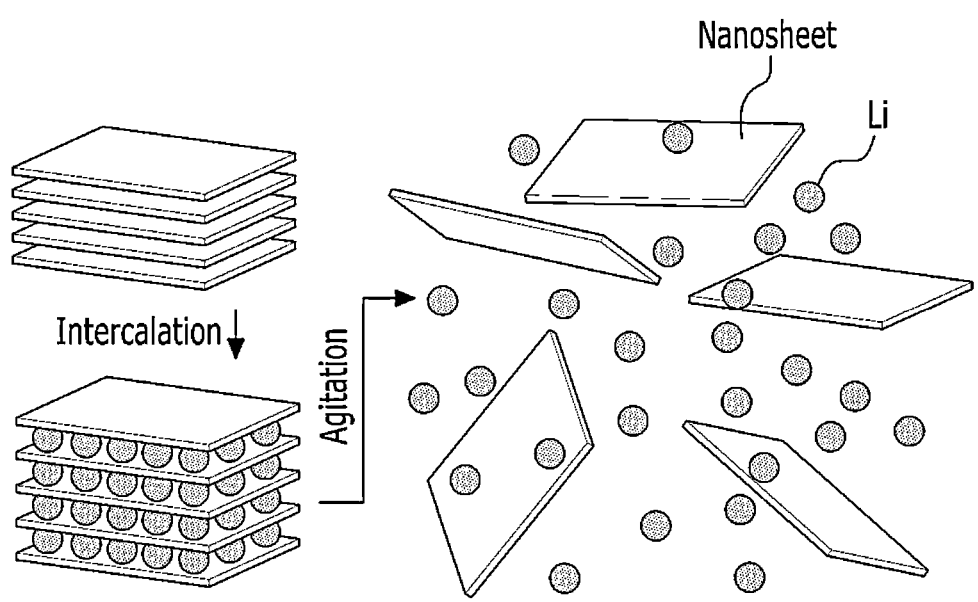
FIG. 15 illustrates an example of exfoliation using intercalation in a method of forming an electrically conductive film according to example embodiments.

FIG. 15 illustrates an example of exfoliation using intercalation in a method of forming an electrically conductive film according to example embodiments.

Referring to FIG. 15, in order to promote the exfoliation, lithium atoms may be intercalated into the compound having a layered crystal structure. According to example embodiments, the compound (e.g., the transition metal rich chalcogenide) is immersed in an alkyl lithium (e.g., butyllithium) solution in an aliphatic hydrocarbon solvent such as hexane to intercalate lithium atoms into the compound, and the intercalated product thus obtained is subjected to ultrasonication to provide a plurality of nanosheets including the compound. For example, by putting the intercalated product in water, water and the intercalated lithium ion may react to generate hydrogen between the layers of the crystal structure, so as to accelerate the interlayer separation. The obtained nanosheets are separated according to an appropriate method (e.g., centrifugation) and washed.

Figure 16:
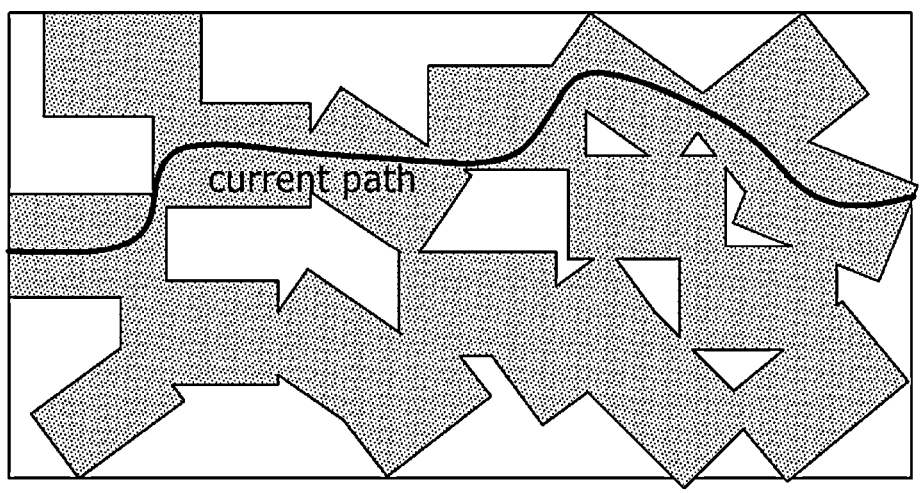
FIGS. 16 and 17 illustrate an example of bring nanosheets in contact with each other in a method of forming an electrically conductive film according to example embodiments.
Figure 17:
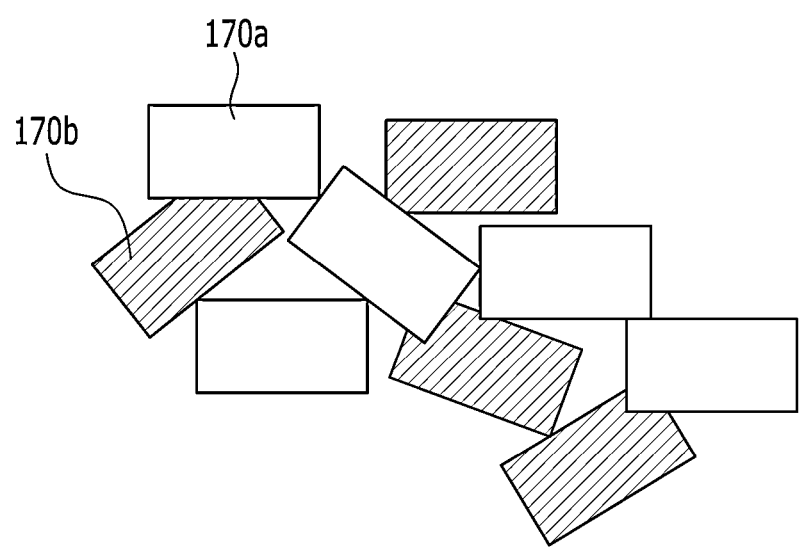

FIGS. 16 and 17 illustrate an example of bring nanosheets in contact with each other in a method of forming an electrically conductive film according to example embodiments.

Referring to FIG. 16, the obtained nanosheets may be physically brought into contact with each other so as to provide electrical connection, and thereby they may be prepared as a transparent electrically conductive film. The length of nanosheets is not particularly limited, but may be appropriately adjusted. For example, the nanosheet may have a length of less than or equal to about 500 μm, for example, of about 10 nm to about 10 μm, but is not limited thereto. When the nanosheets are physically connected to form a film being as thin as possible, the prepared film may show enhanced light transmittance. The film thus prepared may have a thickness of less than or equal to about 100 nm, for example less than or equal to about 5 nm, showing a very high level of transmittance. The obtained film may have high transmittance (e.g., greater than or equal to about 80%, or greater than or equal to about 85%) when the thickness is less than or equal to about 100 nm, for example, less than or equal to about 5 nm. The obtained film may have coverage of greater than or equal to about 20%, for example, greater than or equal to about 50%. The nanosheets may be used to form a film in any conventional method. For example, the formation of the film may be carried out by dip coating, spray coating, printing after forming an ink or a paste, and the like.

According to example embodiments, the manufactured nanosheets are added to deionized water, and the resultant dispersion is ultrasonicated again. An organic solvent that is not miscible with water (e.g., an aromatic hydrocarbon such as xylene or toluene) is added to the ultrasonicated dispersion. When the mixture thus obtained is shaken, a thin film including nanosheets is formed at the interface between the water and the organic solvent. When a clean, wetted, and oxygen plasma-treated glass substrate is slightly dipped to the interface and slowly taken out, the thin film including nanosheets is spread out on the substrate at the interface. The thickness of the thin film may be adjusted by controlling the concentration of the nanosheets per surface area of the interface between water and the organic solvent and a speed and/or an angle when the substrate is taken out.

Although FIG. 16 illustrates an example where an electrically conductive thin film is formed by bring a plurality of nanosheets of a same compound into contact with each other, example embodiments are not limited thereto.

For example, referring to FIG. 17, an electrically conductive thin film may be formed when a plurality of first nanosheets 170a are brought into contact with each other and/or a plurality of second nanosheets 170b. The plurality of second nanosheets 170b may contact each other and/or the plurality of first nanosheets 170a to define a contiguous network of first and second nanosheets 170a and 170b that is configured to provide a current path. The first nanosheets and the second nanosheets 170a and 170b may be formed of different ones of the aforementioned compounds according to example embodiments. For example, the first and second nanosheets 170a and 170b may be formed of different compounds selected from $Ag_2F$, $Cs_3O$, $Hf_3Te_2$, $Sr_2N$, $(Ta, Nb)_5S_2$, $Y_2C$, $Ti_2O$, $Ba_2N$, $Nb_2C$, $Ba_3N$, $Ta_2Se$, and a combination thereof.

Electrically conductive thin films according to example embodiments show high conductivity, enhanced light transmittance, and excellent flexibility, and thus may replace an electrode including a transparent conductive oxide such as ITO, ZnO, and the like and a transparent film including a Ag nanowire.

An electronic device may include electrically conductive thin films according to example embodiments. The electronic device may include, for example, a flat panel display (e.g., LCD, LED, and OLED), a touch screen panel, a solar cell, an e-window, a heat mirror, a transparent transistor, or a flexible display, but is not limited thereto.

Figure 10:
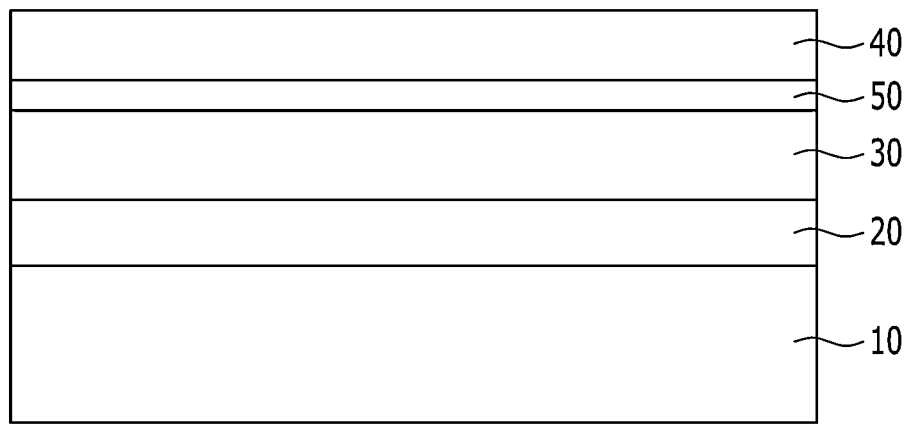
FIG. 10 is a cross-sectional view of an organic light emitting diode device including an electrically conductive thin film according to example embodiments.

FIG. 10 is a cross-sectional view of an organic light emitting diode device including an electrically conductive thin film according to example embodiments.

An organic light emitting diode device according to example embodiments includes a substrate 10, a lower electrode 20, an upper electrode 40 facing the lower electrode 20, and an emission layer 30 interposed between the lower electrode 20 and the upper electrode 40.

The substrate 10 may be made of an inorganic material or an organic material. The inorganic material may be glass or a semiconductor such as silicon (e.g., silicon wafer). The organic material may be a transparent polymer or ceramic. For example, the organic material may be polycarbonate, polymethyl methacrylate, polyethylene terephthalate, polyethylene naphthalate, polyamide, polyethersulfone, polyimide, or a combination thereof. However, example embodiments are not limited thereto.

One of the lower electrode 20 and the upper electrode 40 is a cathode and the other is an anode. For example, the lower electrode 20 may be an anode and the upper electrode 40 may be a cathode.

At least one of the lower electrode 20 and the upper electrode 40 may be a transparent electrode. One of the lower electrode 20 and the upper electrode 40 may a reflective electrode if the other of the lower electrode 20 and the upper electrode 40 is the transparent electrode. When the lower electrode 20 is a transparent electrode and the upper electrode 40 is a reflective electrode, the organic light emitting diode device may have a bottom emission structure in which light is emitted toward the substrate 10. The reflective electrode may include a metal film that includes at least one of Ag, Mg, Al, Pt, Pd, Au, Ni, Nd, Ir, Cr, and a combination thereof. Alternatively, when the upper electrode 40 is a transparent electrode and the lower electrode 20 is a reflective electrode, the organic light emitting diode device may have a top emission structure in which light is emitted away from the substrate 10. Alternatively, both the lower electrode 20 and the upper electrode 40 may be transparent electrodes. When the lower electrode 20 and upper electrode 40 are both transparent electrodes, light may be emitted toward the substrate 10 and away from the substrate 10.

The transparent electrode may include one of the above-described electrically conductive thin films according to example embodiments. The electrically conductive thin film may have high electron density and low work function and thus may be advantageously utilized in the cathode of the OLED requiring low work function. By using a transparent electrically conductive thin film according to example embodiments, the conventional LiF/Al or MgAg alloy may be substituted to a single material.

The emission layer 30 may be made of an organic material inherently emitting one among three primary colors such as red, green, blue, and the like, or a mixture of an inorganic material with the organic material, for example, a polyfluorene derivative, a (poly)paraphenylene vinylene derivative, a polyphenylene derivative, a polyvinylcarbazole, a polythiophene derivative, or a compound prepared by doping these polymer materials with a perylene-based pigment, a coumarin-based pigment, a Rhodamine-based pigment, rubrene, perylene, 9,10-diphenylanthracene, tetraphenylbutadiene, Nile red, coumarin, quinacridone, and the like. An organic light emitting device displays a desirable image by a special combination of primary colors emitted by an emission layer therein.

The emission layer 30 may emit white light by combining basic colors such as three primary colors of red, green, and blue, and in this case, the color combination may provide white light by combining the colors of adjacent pixels or by combining colors laminated in a perpendicular direction.

An auxiliary layer 50 may be positioned between the emission layer 30 and the upper electrode 40 to improve luminous efficiency of the emission layer 30. In the drawing, the auxiliary layer 50 is shown only between the emission layer 30 and the upper electrode 40, but it is not limited thereto. The auxiliary layer 50 may be positioned between the emission layer 30 and the lower electrode 20, or between the emission layer 30 and the upper electrode 40 and between the emission layer 30 and the lower electrode 20.

The auxiliary layer 50 may include an electron transport layer (ETL) and a hole transport layer (HTL) for balancing between electrons and holes, an electron injection layer (EIL), a hole injection layer (HIL) for reinforcing injection of electrons and holes, and the like. It may include one or more layers selected therefrom. The hole transport layer (HTL) may include polyethylene dioxythiophene ("PEDOT"), but is not limited thereto.

In addition, an example of applying an electrically conductive thin film according to example embodiments to an organic light emitting diode device is illustrated, but an electrically conductive thin film according to example embodiments may be used as an electrode for other electronic devices including a transparent electrode without a particular limit. For example, electrically conductive thin films according to example embodiments may be applied as a pixel electrode and/or a common electrode for a liquid crystal display (LCD), an anode and/or a cathode for an organic light emitting diode device, a display electrode for a plasma display device, and a transparent electrode for a touch panel device.

Hereinafter, non-limiting examples of example embodiments are described. These examples, however, are not in any sense to be interpreted as limiting the scope of this disclosure.

EXAMPLES

Example 1: Preparation of a $Hf_3Te_2$ Thin Film

A Hf powder and a $HfTe_2$ powder are mixed at a molar ratio of 2:1. The resulting mixture is sintered under a pressure of 900 kgf/cm$^2$ at a temperature of 1000° C. for about one hour to provide a sintered body having a density of 95% of its ideal density.

Pulsed laser deposition (PLD) is conducted on an $Al_2O_3$ substrate under the following conditions using the sintered body prepared above as a target and using a Nd/YAG laser.

PLD device: PLD 5000 Deposition Systems, PVD Products

Figure 11:
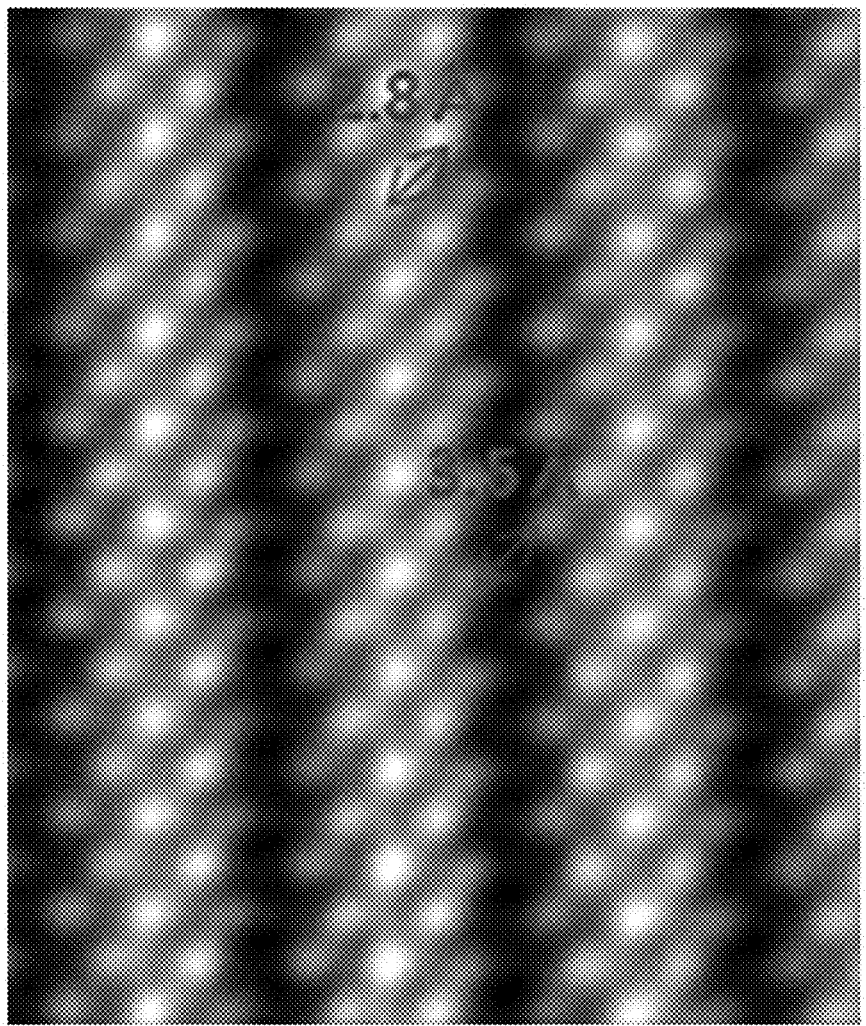
FIG. 11 is a TEM image of a $Hf_3Te_2$ thin film prepared in Example 1.

Output: 60 mJ/cm$^2$
Time: 20 min
Substrate temperature: 600° C.
Vacuum degree: $2*10^{-6}$ Pa The $Hf_3Te_2$ vapor deposited film thus prepared has a thickness of about 20 nm. The TEM image of the vapor deposited film thus prepared is shown in FIG. 11, which confirms that the $Hf_3Te_2$ film thus formed has a layered crystal structure.

Example 2: Preparation of Thin Film Including $Hf_3Te_2$ Nanosheets

The $Hf_3Te_2$ sintered body prepared from Example 1 is pulverized and the obtained powder is dispersed in 1.6 M of butyllithium solution in hexane including butyllithium dissolved therein, and the resulting dispersion is agitated for 72 hours. Then, the powder is taken out from the dispersion and washed with hexane and dried under an argon atmosphere to obtain lithium intercalated powder of $Hf_3Te_2$. 15-20 g of lithium intercalated powder of $Hf_3Te_2$ is placed in a vial in a glove box, and then 5-10 ml of water is added thereto and the resulting mixture is subjected to ultrasonication for one hour. With the generation of hydrogen gas, interlayer separation occurs to provide $Hf_3Te_2$ nanosheets.

The nanosheets thus obtained are centrifuged and the precipitate is washed with water until it shows a pH of about 7 and centrifuged again.

The obtained nanosheet precipitate is placed in a vial and added with 3 ml of deionized water and ultrasonicated. 2-3 ml of toluene is added thereto, and the vial is stirred to provide a thin film including nanosheets at the interface between the aqueous layer and the toluene layer. A glass substrate treated with oxygen plasma is slightly dipped into the interface and pulled up so that a film including the $Hf_3Te_2$ nanosheets present at the interface is spread on the glass substrate.

Example 3: Preparation of the Sintered Body of Titanium Suboxide ($Ti_2O$) and a Thin Film Formation Thereof A Ti powder (>99%, Aldrich) and a $TiO_2$ powder (99.9%, Aldrich) are weighed in an amount such that the mole ratio of titanium to oxygen is 2:1 (Ti:O) and are mixed well using a mortar. In order to facilitate the deposition, the mixed powder is placed in a metal mold and pelletized in a shape of a coin. The pellet thus obtained is placed in a glass tube, which is then vacuum-sealed. The vacuum sealed tube is put into an electric furnace and heat-treated at 700° C. for 24 hours. The heat treated pellet is pulverized using a mortar and the pulverized product is sintered using spark plasma sintering (SPS) equipment under the conditions of 850° C./80 MPa for 5 minutes. The synthesized polycrystalline bulk material has a density of 80% based on its ideal density and its conductivity is measured to be 5600 S/cm, which may further increase when the material is prepared as a monocrystalline bulk sample.

An X-ray diffraction analysis is conducted for the prepared bulk material and the results confirm the synthesis of titanium suboxide ($Ti_2O$).

The bulk material is used to form a thin film in the same manner as set forth in Example 1 and Example 2.

While some example embodiments have been particularly shown and described, it will be understood by one of ordinary skill in the art that variations in form and detail may be made therein without departing from the spirit and scope of the claims.

What is claimed is:

1. An electronic device comprising:
    an electrode including an electrically conductive film, wherein
    the electrically conductive film includes a compound having a layered crystal structure, and the compound includes one of,
        an alkali metal suboxide represented by $A_3O$, $A_2O$, $A_6O$, or $A_7O$ (wherein A includes one of Cs, Rb, K, Na, and a combination thereof),
        a transition metal suboxide represented by $M_2O$ (wherein M includes one of Sc, Y, Ti, Zr, Hf, V, Nb, Ta, Cr, Mo, W, Mn, Tc, Re, Ag and a combination thereof), an alkali earth metal subnitride represented by $AE_2N$ (wherein AE is Mg, Sr, Ba, or a combination thereof) or $AE_3N$ (wherein AE is Mg, Ca, Sr, Ba, or a combination thereof), a transition element subcarbide represented by $M_2C$ or $M_4C$ (wherein M includes one of Sc, Y, Ti, Zr, Hf, V, Nb, Ta, Cr, Mo, W, Mn, Tc, Re, Ag, and a combination thereof), a transition metal rich chalcogenide represented by $M_3E_2$, $M_2E$, $M_5E$, $M_5E_2$, $M_4E_3$, or ME (wherein M includes one of Sc, Y, Ti, Zr, Hf, V, Nb, Ta, Cr, Mo, W, Mn, Tc, Re, Ag, and a combination thereof, and E is one of S, Se, and Te), and a transition metal subhalide represented by $M_2X$ or MX (wherein M includes one of Sc, Y, Ti, Zr, Hf, V, Nb, Ta, Mn, Tc, Re, Ag, and a combination thereof, and X include one of F, Cl, Br, and I), wherein the compound has a product of an absorption coefficient ($\alpha$) for light having a wavelength of about 550 nm at 25° C. and a resistivity value ($\rho$) thereof of less than or equal to about 30 Ω/sq, the electrically conductive film has a thickness of less than or equal to about 100 nm, and a transmittance of the electrically conductive film is greater than or equal to about 80% for light of about 550 nm.

2. The electronic device of claim 1, wherein the resistivity value ($\rho$) of the compound is less than or equal to about 5 Ω/sq and greater than or equal to about 0 Ω/sq.

3. The electronic device of claim 1, wherein the layered crystal structure is one of a trigonal system with a P-3m1 space group, a trigonal system with a R3-MH space group, a tetragonal system with a I4/MMM space group, and a hexagonal system with a P63/mcm space group.

4. The electronic device of claim 1, wherein the compound includes a two-dimensional electron gas layer.

5. The electronic device of claim 1, wherein the compound includes unit structures, and a binding energy between the unit structures of the compound is greater than 0 meV/Å$^2$ and less than or equal to about 100 meV/Å$^2$.

6. The electronic device of claim 1, wherein the compound is selected from $Ag_2F$, $Cs_3O$, $Hf_3Te_2$, $Sr_2N$, $(Ta, Nb)_5S_2$, $Y_2C$, $Ti_2O$, $Ba_2N$, $Nb_2C$, $Ba_3N$, $Ta_2Se$, and a combination thereof.

7. The electronic device of claim 1, wherein the electrically conductive film is a continuous film.

8. The electronic device of claim 1, comprising:

a plurality of nanosheets stacked on top of each other, wherein each one of the plurality of nanosheets include the compound.

9. The electronic device of claim 1, wherein the electronic device is one of a flat panel display, a touch screen panel, a solar cell, an e-window, an electrochromic mirror, a heat mirror, a transparent transistor, and a flexible display.

10. The electronic device of claim 1, further comprising:

a substrate, wherein the electrode is on the substrate.

11. The electronic device of claim 10, further comprising:

a lower electrode on the substrate;

an emission layer on the lower electrode, the emission layer being configured to emit light; and an upper electrode on the emission layer, wherein at least one of the lower electrode and the upper electrode includes the lower electrode including the electrically conductive film.

12. An electronic device comprising:

a substrate; and an electrode including an electrically conductive film on the substrate, the electrically conductive film including a compound having a layered crystal structure;

the compound includes a transition metal rich chalcogenide represented by $M_3E_2$, M includes one of Sc, Y, Ti, Zr, Hf, V, Nb, Ta, Cr, Mo, W, Mn, Tc, Re, Ag, and a combination thereof, and E is one of S, Se, and Te, wherein the compound has a product of an absorption coefficient ($\alpha$) for light having a wavelength of about 550 nm at 25° C. and a resistivity value ($\rho$) thereof of less than or equal to about 30 Ω/sq, the electrically conductive film has a thickness of less than or equal to about 100 nm, and a transmittance of the electrically conductive film is greater than or equal to about 80% for light of about 550 nm.

13. The electronic device of claim 12, wherein the compound is represented by $M_3E_2$, M is Hf, and E is Te.

* * * * *